United States Patent
Takahashi et al.

(10) Patent No.: US 8,053,684 B2
(45) Date of Patent: Nov. 8, 2011

(54) MOUNTING STRUCTURE AND METHOD FOR MOUNTING ELECTRONIC COMPONENT ONTO CIRCUIT BOARD

(75) Inventors: Shigemasa Takahashi, Kanagawa (JP); Takashi Yamada, Kanagawa (JP); Shinji Mizuno, Kanagawa (JP); Masahiro Kitahara, Kanagawa (JP); Daisuke Makino, Kanagawa (JP)

(73) Assignee: Teikoku Tsushin Kogyo Co., Ltd. (JP)

( * ) Notice: Subject to any disclaimer, the term of this patent is extended or adjusted under 35 U.S.C. 154(b) by 752 days.

(21) Appl. No.: 12/158,904

(22) PCT Filed: Dec. 19, 2006

(86) PCT No.: PCT/JP2006/325252
§ 371 (c)(1),
(2), (4) Date: Jun. 23, 2008

(87) PCT Pub. No.: WO2007/072812
PCT Pub. Date: Jun. 28, 2007

(65) Prior Publication Data
US 2009/0277684 A1 Nov. 12, 2009

(30) Foreign Application Priority Data

Dec. 23, 2005 (JP) .................................. 2005-371183
Apr. 5, 2006 (JP) .................................. 2006-104285

(51) Int. Cl.
*H01L 23/28* (2006.01)
(52) U.S. Cl. .... 174/525; 174/521; 174/534; 264/272.15
(58) Field of Classification Search ............. 264/272.11, 264/272.15; 174/521, 525, 534
See application file for complete search history.

(56) References Cited

U.S. PATENT DOCUMENTS

| 5,106,785 | A | * | 4/1992 | Rauchmaul et al. | 29/856 |
| 6,036,908 | A | * | 3/2000 | Nishida et al. | 264/254 |
| 6,128,195 | A | * | 10/2000 | Weber et al. | 361/737 |
| 6,482,346 | B1 | * | 11/2002 | Alcazar | 264/263 |
| 2002/0029900 | A1 | * | 3/2002 | Wimberger et al. | 174/258 |
| 2002/0109264 | A1 | * | 8/2002 | Lechner | 264/272.11 |

FOREIGN PATENT DOCUMENTS

| JP | 9-283195 | 10/1997 |
| JP | 10-172713 | 6/1998 |
| JP | 11-40917 | 2/1999 |
| JP | 2002-86487 | 3/2002 |
| JP | 2003-197068 | 7/2003 |
| JP | 2003-288971 | 10/2003 |

OTHER PUBLICATIONS

Machined Translation for JP 10-172713 Apr. 23, 2011, 10 pages.*
International Search Report for International Application No. PCT/JP2006/325252 mailed Mar. 13, 2007.
Japanese Office Action for Application No. 2006-104285 mailed Jul. 5, 2011 with English translation.

* cited by examiner

*Primary Examiner* — Hung Ngo
(74) *Attorney, Agent, or Firm* — Cantor Colburn LLP

(57) ABSTRACT

An electronic component mounting structure includes a flexible circuit board having terminal connection patterns formed thereon and a light-emitting component provided with electrodes. The light-emitting component is placed on the flexible circuit board, and a synthetic resin casing is injection-molded to cover the light-emitting component and a portion of the flexible circuit board surrounding the light-emitting component placed thereon, whereby the electrodes of the light-emitting component and the terminal connection patterns of the flexible circuit board are connected in abutting contact with each other.

12 Claims, 14 Drawing Sheets

MOUNTING STRUCTURE AND METHOD FOR MOUNTING ELECTRONIC COMPONENT ONTO CIRCUIT BOARD

CROSS REFERENCE TO RELATED APPLICATIONS

This is a U.S. national stage of application No. PCT/JP2006/325252, filed on 20 Apr. 2007. Priority under 35 U.S.C. §119(a) and 35 U.S.C. §365(b) is claimed from Japanese Application No. 2005-371183, filed 23 Dec. 2005, and from Japanese Application No. 2006-104285, filed 5 Apr. 2006 the disclosure of which is also incorporated herein by reference.

TECHNICAL FIELD

The present invention relates to an electronic component mounting structure and method for mounting an electronic component onto a circuit board by using a molding resin.

BACKGROUND ART

Conventionally, surface-mount electronic components are mounted onto circuit boards by the following methods. For example, an electronic component placed on a flexible circuit board is clamped, together with the circuit board, by a clamping member made of a metal plate from the underside of the circuit board, as disclosed in Japanese Patent Application Publication No. Hei 11-40917. According to a method disclosed in Japanese Patent Application Publication No. Hei 7-7249, the upper side of an electronic component placed on a flexible circuit board is covered with a film, and the peripheral portion of the film is secured to the circuit board by ultrasonic welding or the like.

Among electronic components are those having terminals projecting from their casing surfaces, such as sensor switches. Conventionally, such an electronic component is mounted onto a circuit board as follows. For example, an auxiliary board and a mounting member are placed over the electronic component positioned on the circuit board, and resilient portions provided on the mounting member are allowed to resiliently urge the terminals of the electronic component downwardly through the auxiliary board so that the terminals are pressed against electrode patterns on the circuit board, as disclosed in Japanese Patent Application Publication No. 2002-164674.

The above-described conventional electronic component mounting structures suffer, however, from the following problems. Because electronic components have to be mounted onto a circuit board one by one, if a large number of electronic components need to be mounted onto the circuit board, each electronic component may fail to be mounted in the desired position, resulting in an unreliable connection between the circuit board and the electronic components. In addition, mounting of electronic components cannot be efficiently carried out.

DISCLOSURE OF THE INVENTION

Problems to be Solved by the Invention

The present invention has bee made in view of the above-described circumstances. An object of the present invention is to provide an electronic component mounting structure and method capable of mounting electronic components onto a circuit board easily, reliably and efficiently.

Means for Solving the Problems

According to a first feature thereof, the present invention provides an electronic component mounting structure including a circuit board having terminal connection patterns formed thereon and an electronic component provided with terminals. The electronic component is placed on the circuit board, and a synthetic resin casing is provided by injection molding to cover the electronic component and a portion of the circuit board surrounding the electronic component placed thereon, whereby the terminals of the electronic component and the terminal connection patterns of the circuit board are connected in abutting contact with each other.

According to a second feature of the present invention, the electronic component of the electronic component mounting structure according to the first feature has the terminals formed on a surface thereof.

According to a third feature of the present invention, the casing of the electronic component mounting structure according to the second feature is formed by integral molding to extend over the upper and lower sides of the circuit board through openings provided in the circuit board at the periphery of the electronic component placed thereon.

According to a fourth feature of the present invention, the electronic component of the electronic component mounting structure according to the second feature is a light-emitting component having a light-emitting part. The casing is molded such that the light-emitting part is exposed.

According to a fifth feature of the present invention, the circuit board of the electronic component mounting structure according to the second feature is a flexible circuit board.

According to a sixth feature of the present invention, the circuit board of the electronic component mounting structure according to the fifth feature has board bending portions provided outside the electronic component placed thereon. The board bending portions are buried in the casing in the state of being bent toward side surfaces of the electronic component.

According to a seventh feature of the present invention, the circuit board of the electronic component mounting structure according to the fifth feature has board securing portions provided at the respective peripheries of the openings of the circuit board. The board securing portions are buried in the casing in the state of being bent toward the side of the circuit board where the electronic component is placed.

According to an eighth feature of the present invention, the electronic component of the electronic component mounting structure according to the first feature has the terminals projecting from a surface thereof.

According to a ninth feature of the present invention, the casing of the electronic component mounting structure according to the eighth feature is provided to cover at least abutting contact portions where the terminals and the terminal connection patterns of the circuit board are in abutting contact with each other.

According to a tenth feature of the present invention, the circuit board of the electronic component mounting structure according to the eighth feature is a flexible circuit board.

According to an eleventh feature of the present invention, the casing of the electronic component mounting structure according to the eighth feature is formed by integrally molding a first casing part and a second casing part. The first casing part is provided on the side of the circuit board where the electronic component is placed so as to enclose the outer periphery of the electronic component. The second casing part is provided on the side of the circuit board opposite to the side thereof where the electronic component is placed to cover a portion opposing the first casing part.

According to a twelfth feature of the present invention, the second casing part of the electronic component mounting structure according to the eleventh feature is provided with positioning portions for positioning the second casing part with respect to another member.

According to a thirteenth feature thereof, the present invention provides an electronic component mounting method including the step of preparing a circuit board having terminal connection patterns formed thereon and an electronic component provided with terminals and placing the electronic component on the circuit board, and the step of setting the circuit board and the electronic component in a mold. The method further includes the step of injecting a molten molding resin into a cavity in the mold having the configuration of a casing that is to be formed to enclose the electronic component and a portion of the circuit board surrounding the electronic component placed thereon, and the step of removing the mold after the molten molding resin has solidified, whereby the terminals of the electronic component and the terminal connection patterns of the circuit board are connected in abutting contact with each other.

According to a fourteenth feature of the present invention, the electronic component in the electronic component mounting method according to the thirteenth feature has the terminals formed on a surface thereof.

According to a fifteenth feature of the present invention, the circuit board in the electronic component mounting method according to the fourteenth feature has openings provided at the periphery of the electronic component placed thereon. When the molten molding resin is injection-molded, the casing is molded to extend over the upper and lower sides of the circuit board through the openings.

According to a sixteenth feature of the present invention, the electronic component mounting method according to the fifteenth feature is carried out as follows. The electronic component placed on the circuit board and set in the mold is in abutting contact with the inner surface of the mold at a surface thereof opposite to the surface thereof placed on the circuit board. Moreover, the molten molding resin is injected toward the surface of the circuit board opposite to the surface thereof on which the electronic component is placed, thereby filling the molten molding resin also to the side of the circuit board where the electronic component is placed through the openings while pressing the circuit board against the electronic component.

According to a seventeenth feature of the present invention, the electronic component in the electronic component mounting method according to the sixteenth feature is a light-emitting component having a light-emitting part. The surface of the light-emitting part is kept in abutting contact with the inner surface of the mold when the molten molding resin is injected toward the surface of the circuit board reverse to the surface thereof on which the electronic component is placed, whereby the light-emitting part is exposed on the surface of the casing.

According to an eighteenth feature of the present invention, the circuit board in the electronic component mounting method according to the sixteenth feature is a flexible circuit board.

According to a nineteenth feature of the present invention, the circuit board in the electronic component mounting method according to the eighteenth feature has slits previously formed at the periphery of the electronic component placed thereon, and the molten molding resin is injected toward the surface of the circuit board reverse to the surface thereof on which the electronic component is placed, whereby the circuit board is pressed against the electronic component, and while doing so, portions of the circuit board around the slits are forced to open toward the side of the circuit board where the electronic component is placed, thereby forming the openings.

According to a twentieth feature of the present invention, the circuit board in the electronic component mounting method according to the nineteenth feature has board bending portions provided outside the electronic component placed thereon as a result of formation of the openings by forcing open the portions of the circuit board around the slits. The board bending portions are buried in the casing in the state of being bent toward side surfaces of the electronic component.

According to a twenty-first feature of the present invention, the circuit board in the electronic component mounting method according to the nineteenth feature has board securing portions provided at the respective peripheries of the openings as a result of formation of the openings by forcing open the portions of the circuit board around the slits. The board securing portions are buried in the casing in the state of being bent toward the side of the circuit board where the electronic component is placed.

According to a twenty-second feature of the present invention, the electronic component in the electronic component mounting method according to the thirteenth feature has the terminals projecting from a surface thereof.

According to a twenty-third feature of the present invention, the electronic component mounting method according to the twenty-second feature is arranged such that when the circuit board and the electronic component are set in the mold, abutting contact portions where the terminals and the terminal connection patterns of the circuit board are in abutting contact with each other are clamped from both sides thereof with a pair of pressing portions provided in the cavity.

According to a twenty-fourth feature of the present invention, the electronic component in the electronic component mounting method according to the twenty-second feature has retainers projecting from the surface thereof in addition to the terminals. When the circuit board and the electronic component are set in the mold, portions where the retainers and the circuit board are in abutting contact with each other outside the cavity are clamped from both sides thereof with a pair of retaining portions provided on the mold.

Effect of the Invention

Thus, according to the first feature of the present invention, the electronic component is mounted onto the circuit board by molding of the casing. Therefore, positioning of the circuit board, the electronic component and the casing can be effected accurately in the molding mold. Accordingly, the electronic component can be mounted accurately, and the mounting operation becomes efficient and can be automated and facilitated. The electronic component mounting structure according to the present invention is particularly effective when it is used to mount a plurality of electronic components onto the circuit board by a single molding operation.

According to the second feature of the present invention, the electronic component may be one that has the terminals formed on a surface thereof.

According to the third feature of the present invention, the casing is integrally molded to extend over the upper and lower sides of the circuit board. Therefore, the strength with which the electronic component is secured to the circuit board by the casing is increased. This is particularly effective when the circuit board is a flexible circuit board.

According to the fourth feature of the present invention, even if a light-emitting component is mounted onto the circuit board by using the casing, the light-emitting part of the light-emitting component can be exposed to the outside. Therefore, the amount of emitted light will not be reduced by the casing.

According to the fifth feature of the present invention, the circuit board may be a flexible circuit board.

According to the sixth feature of the present invention, a surface-mount electronic component can be mounted onto the circuit board even more reliably.

According to the seventh feature of the present invention, the board securing portions enable the casing to be secured to the circuit board even more reliably and firmly.

According to the eighth feature of the present invention, the electronic component may be one that has the terminals projecting from a surface thereof.

According to the ninth feature of the present invention, it is possible to increase the securing strength of the abutting contact portions where the terminals of the electronic component and the terminal connection patterns of the circuit board are secured to each other by the casing. This is particularly effective when the circuit board is a flexible circuit board.

According to the tenth feature of the present invention, the circuit board of the electronic component mounting structure according to the eighth feature may be a flexible circuit board.

According to the eleventh feature of the present invention, the first casing part is molded to enclose the outer periphery of the electronic component. Therefore, the electronic component itself is not covered with the casing. Accordingly, the electronic component is not subjected to an external force that would otherwise be applied thereto when the electronic component itself is covered with the casing. Consequently, there is no possibility that the operation of the mechanical part of the electronic component will be impaired by the external force.

According to the twelfth feature of the present invention, the second casing part is provided with positioning portions. Therefore, the positioning portions can be used in place of positioning portions provided on the electronic component if the latter positioning portions become impossible to use due to the molding of the casing.

According to the thirteenth feature of the present invention, the electronic component is mounted onto the circuit board by molding of the casing. Therefore, the mounting operation becomes efficient and can be automated and facilitated. The electronic component mounting method according to the present invention is particularly effective when it is used to mount a plurality of electronic components onto the circuit board by a single molding operation.

According to the fourteenth feature of the present invention, the electronic component in the electronic component mounting method according to the thirteenth feature may be one that has the terminals formed on a surface thereof.

According to the fifteenth feature of the present invention, the casing is integrally molded to extend over the upper and lower sides of the circuit board. Therefore, the strength with which the electronic component is secured to the circuit board by the casing is increased. This is particularly effective when the circuit board is a flexible circuit board.

According to the sixteenth feature of the present invention, the casing is molded while the circuit board is being pressed against the electronic component by the molten molding resin. Therefore, the electronic component can be mounted onto the circuit board even more reliably.

According to the seventeenth feature of the present invention, even if a light-emitting component is mounted onto the circuit board by using the casing, the light-emitting part of the light-emitting component can be readily exposed to the outside.

According to the eighteenth feature of the present invention, the circuit board in the electronic component mounting method according to the sixteenth feature may be a flexible circuit board.

According to the nineteenth feature of the present invention, the casing can be molded in a state where the terminal connection patterns of the circuit board and the terminals of the electronic component are connected firmly and reliably simply by placing them in abutting contact with each other even if solder or an electrically conductive adhesive is not used to connect and secure the terminal connection patterns and the terminals.

According to the twentieth feature of the present invention, the molten resin for molding the casing will not enter between the terminal connection patterns of the circuit board and the terminals of the electronic component.

According to the twenty-first feature of the present invention, the board securing portions, which are formed by bending the circuit board, can be readily buried in the casing. The board securing portions enable the casing to be secured to the circuit board even more reliably and firmly.

According to the twenty-second feature of the present invention, the electronic component in the electronic component mounting method according to the thirteenth feature may be one that has the terminals projecting from a surface thereof.

According to the twenty-third feature of the present invention, the connection between the terminals and the terminal connection patterns of the circuit board becomes reliable.

According to the twenty-fourth feature of the present invention, the circuit board and the electronic component can be set and secured in the mold without applying an external force directly to the electronic component except the retainer. Therefore, the electronic component will not be deformed or broken, and the connection between the circuit board and the electronic component becomes reliable.

BRIEF DESCRIPTION OF THE DRAWINGS

FIG. 18(*b*) is a schematic sectional side view [taken along the line B-B in FIG. 18(*c*)] of the electronic component mounting structure according to the sixth embodiment of the present invention.

FIG. 18(*c*) is a rear view of the electronic component mounting structure according to the sixth embodiment of the present invention.

EXPLANATION OF REFERENCE SYMBOLS

Figure 1:
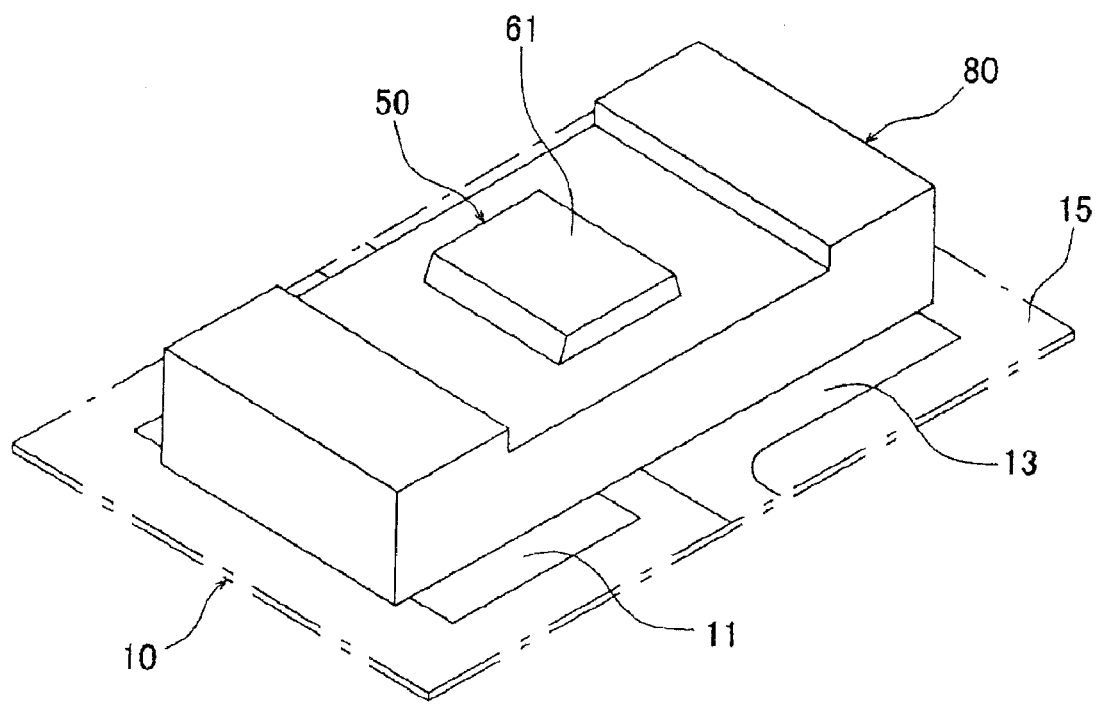
FIG. 1 is a perspective view from above of a mounting structure of a light-emitting component onto a flexible circuit board according to a first embodiment of the present invention.

10: flexible circuit board (circuit board)
11, 13: terminal connection pattern
17, 19: slit
21, 23: board bending portion (side abutting portion)
25, 27: board securing portion
29, 31: opening
50: light-emitting component (electronic component)
51, 53: electrode (terminal)
61: light-emitting part
80: casing

P1: first mold part (mold)
P13: component abutting portion
P2: second mold part (mold)
P22: resin injection port
C1: cavity
110: flexible circuit board (circuit board)
111, 113: terminal connection pattern
129: opening
150: sensor switch (electronic component)
151, 153: terminal plate (terminal)
155, 157: retainer
180: casing
180A: first casing part
180B: second casing part
181: positioning portion
P101: first mold part (mold)
P102: second mold part (mold)
P105: pressing portion
P107: pressing portion
P108: retaining portion
P109: retaining portion
C101: cavity
T1: abutting contact portion
T2: abutting contact portion

BEST MODE FOR CARRYING OUT THE INVENTION

Embodiments of the present invention will be described below in detail with reference to the accompanying drawings.

First Embodiment

Figure 2:
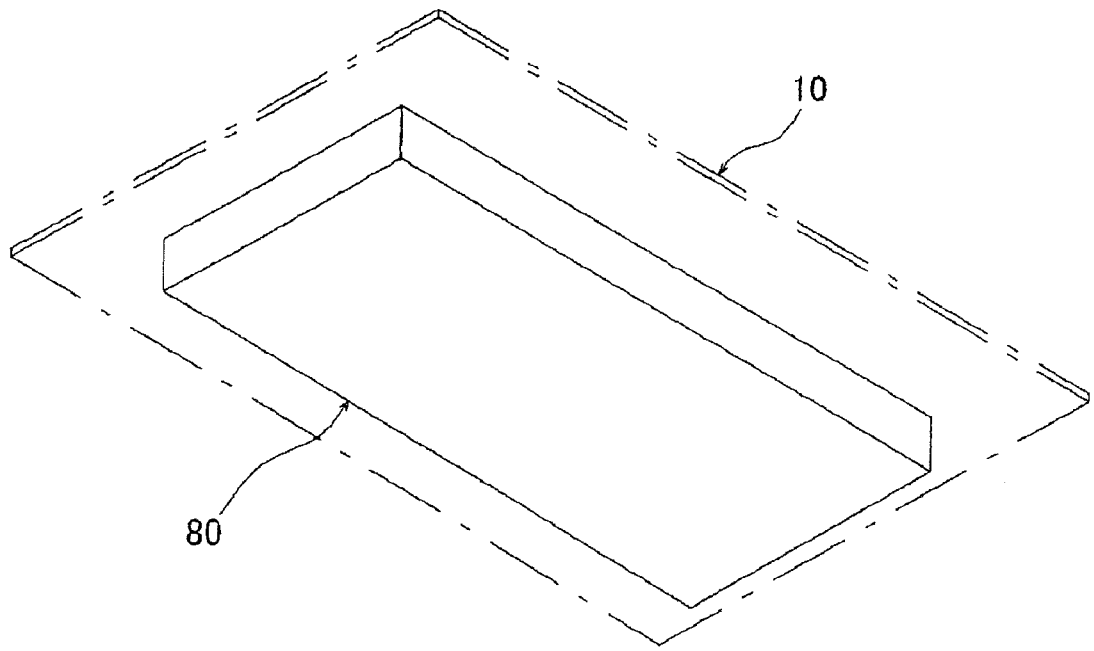
FIG. 2 is a perspective view from below of the mounting structure of the light-emitting component onto the flexible circuit board.
Figure 3:
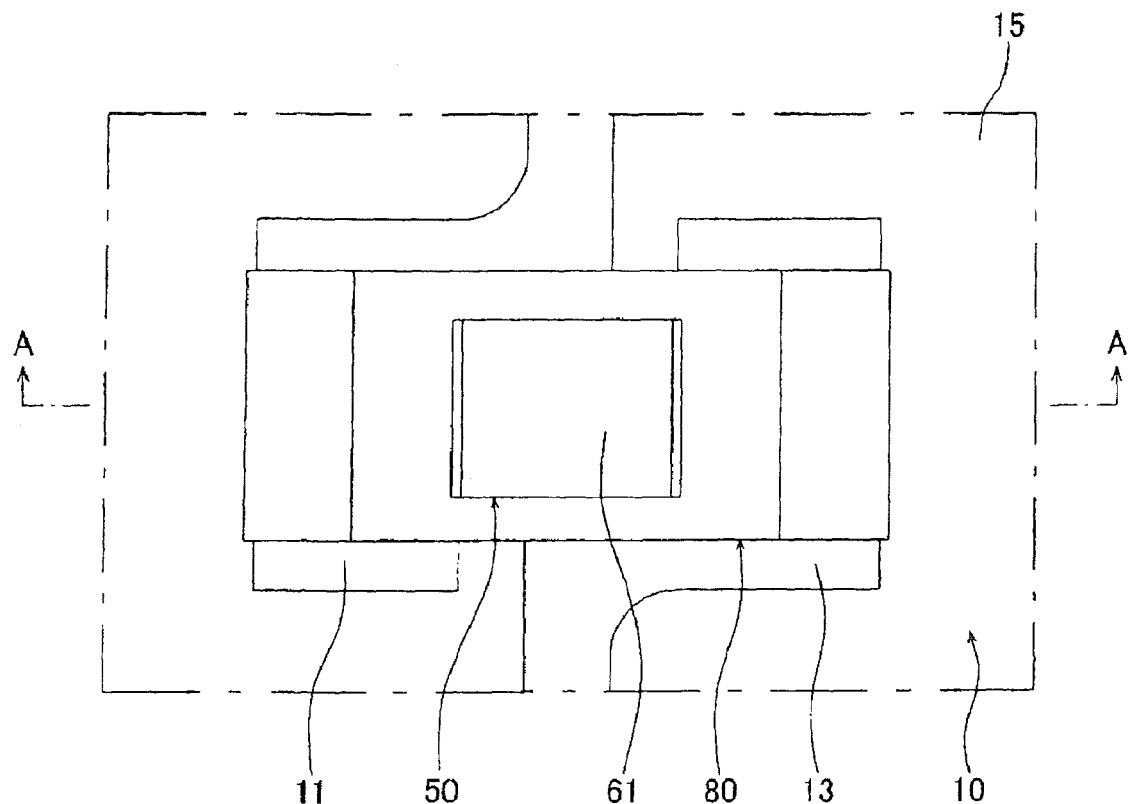
FIG. 3 is a plan view of the mounting structure of the light-emitting component onto the flexible circuit board.
Figure 4:
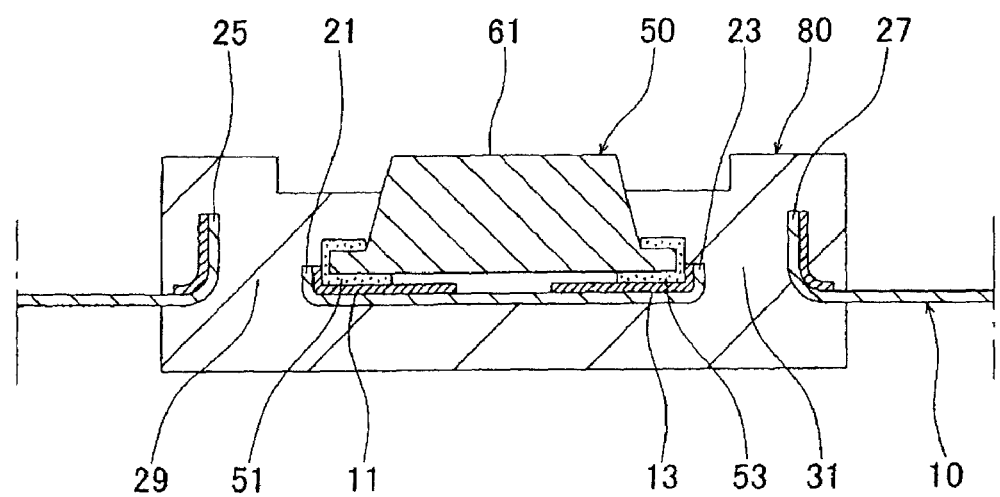
FIG. 4 is a schematic sectional side view (taken along the line A-A in FIG. 3) of the mounting structure of the light-emitting component onto the flexible circuit board.

FIGS. 1 to 4 are diagrams showing a mounting structure of an electronic component onto a circuit board according to a first embodiment of the present invention. FIG. 1 is a perspective view as seen from above. FIG. 2 is a perspective view as seen from below. FIG. 3 is a plan view. FIG. 4 is a schematic sectional side view (taken along the line A-A in FIG. 3). As shown in these figures, the electronic component mounting structure includes a circuit board (hereinafter in this embodiment referred as "flexible circuit board") 10 having a pair of terminal connection patterns 11 and 13 formed thereon. The electronic component mounting structure further includes an electronic component (hereinafter in this embodiment referred to as "light-emitting component") 50 provided with a pair of terminals (hereinafter in this embodiment referred to as "electrodes") 51 and 53. The light-emitting component 50 is placed on the flexible circuit board 10, and a synthetic resin casing 80 is provided by injection molding to cover the light-emitting component 50 and a portion of the flexible circuit board 10 surrounding the light-emitting component 50 placed thereon, thereby connecting the electrodes 51 and 53 of the light-emitting component 50 and the terminal connection patterns 11 and 13 of the flexible circuit board 10 in abutting contact with each other. These constituent parts will be explained below with regard to their configurations, structures and materials, together with a production method therefor.

Figure 5:
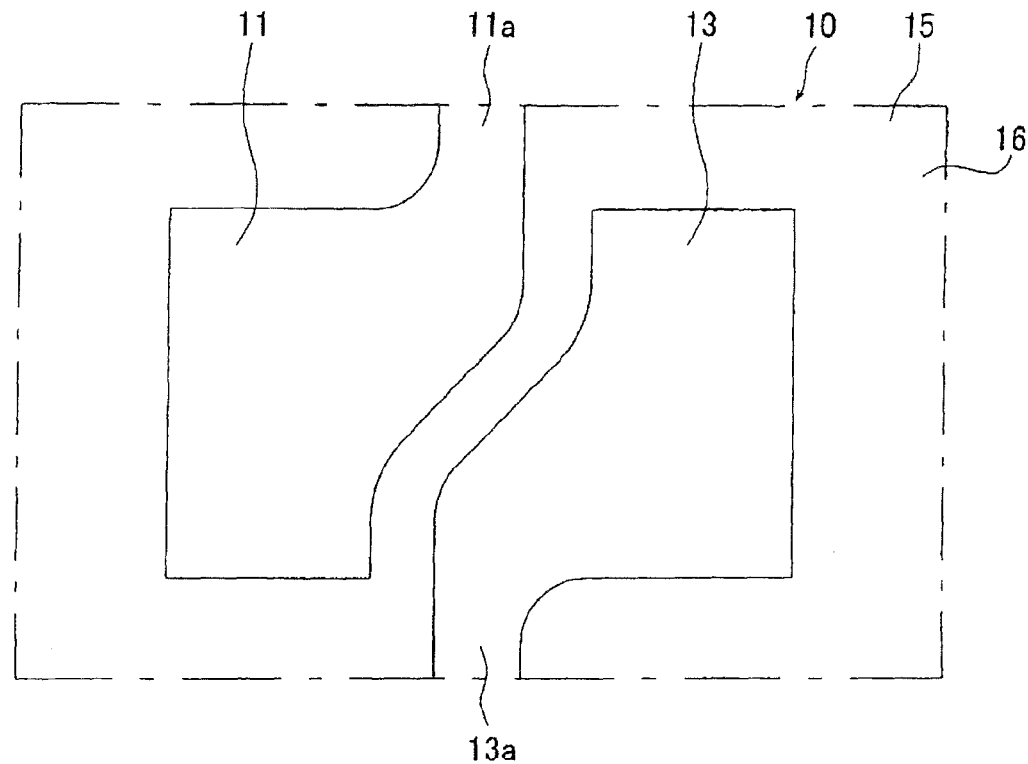
FIG. 5 is a plan view illustrating a production method for the mounting structure of the light-emitting component onto the flexible circuit board.

As shown in FIG. 5, a flexible circuit board 10 is prepared. The flexible circuit board 10 is a flexible synthetic resin film 15 having a surface 16 on which a light-emitting component 50 is to be placed. The flexible circuit board 10 has a pair of mutually opposing terminal connection patterns 11 and 13 provided on the surface 16. Circuit patterns 11*a* and 13*a* are connected to the terminal connection patterns 11 and 13, respectively. The synthetic resin film 15 may be either a thermoplastic synthetic resin film or a thermosetting synthetic resin film. Examples of usable synthetic resin films are polyphenylene sulfide (PPS) film, polyimide (PI) film, polyethylene terephthalate (PET) film, polyethylene naphthalate (PEN) film, and polyether imide (PEI) film. In this embodiment, a PET film is used. The terminal connection patterns 11 and 13 and the circuit patterns 11a and 13a may be formed on the synthetic resin film 15 by using various printing techniques, e.g. screen printing. It is also possible to form them by etching copper foil applied to the surface of the synthetic resin film 15 or by vapor deposition, e.g. sputtering. In this embodiment, the terminal connection patterns 11 and 13 and the circuit patterns 11a and 13a are formed by screen printing using an electrically conductive paste that is prepared by mixing a metal powder (e.g. silver powder) with a resin binder (e.g. a mixture of a urethane resin with a solvent). The terminal connection patterns 11 and 13 are provided at respective positions where they are connected to electrodes 51 and 53 provided on the lower surface of a light-emitting component 50 (described below). The terminal connection patterns 11 and 13 are formed to extend as far as the periphery of the abutting contact surface of the light-emitting component 50.

Figure 6:
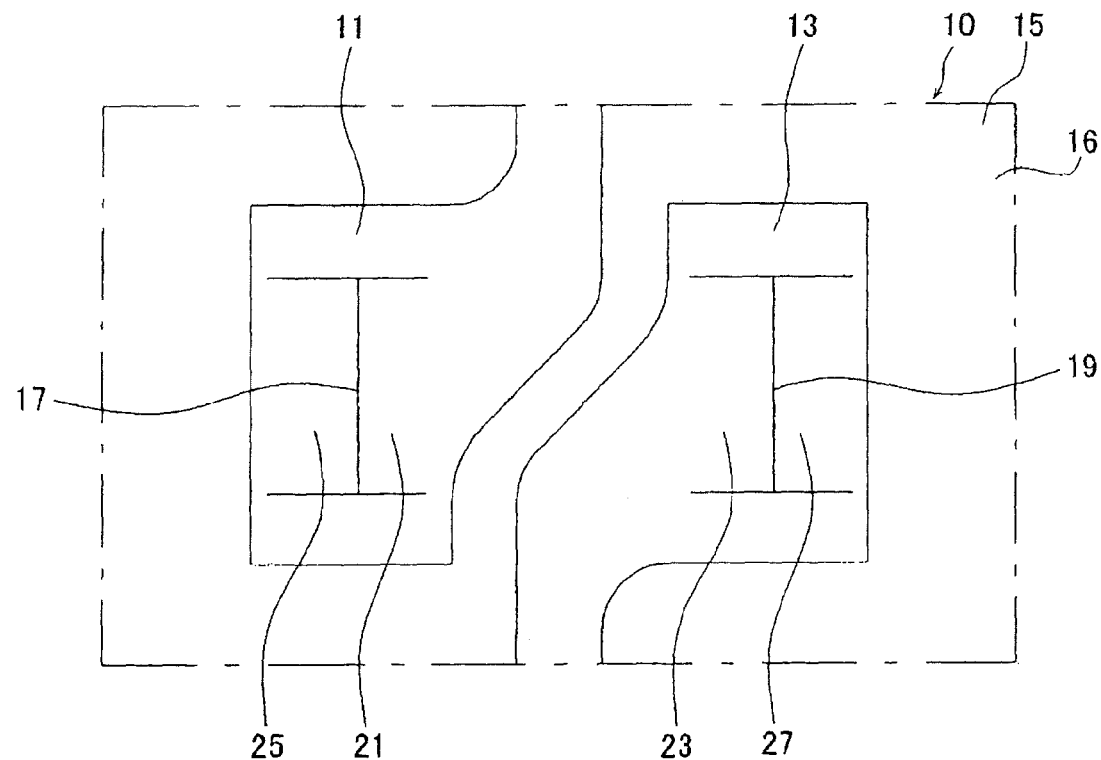
FIG. 6 is a plan view illustrating the production method for the mounting structure of the light-emitting component onto the flexible circuit board.

Next, as shown in FIG. 6, a pair of slits 17 and 19 are formed in the synthetic resin film 15. The slits 17 and 19 have the same H-shaped configuration and are formed by using a punching die or a cutter, for example. The slits 17 and 19 are formed at the periphery of the abutting contact surface of the light-emitting component 50 (described below) to be placed on the flexible circuit board 10. More specifically, the slits 17 and 19 are formed at respective positions that surround at a predetermined distance the outer peripheries of the electrodes 51 and 53 of the light-emitting component 50 to be placed. As a result of formation of the slits 17 and 19 in an H-shaped configuration, tongue-shaped board bending portions (hereinafter referred to as "side abutting portions") 21 and 23 are provided at the mutually opposing inner sides of the slits 17 and 19, and tongue-shaped board securing portions 25 and 27 are provided at the mutually opposing outer sides of the slits 17 and 19. In other words, the board bending portions (side abutting portions) 21 and 23 are provided at respective positions on the flexible circuit board 10 outside the light-emitting component 50 placed thereon. It should be noted that in this embodiment the slits 17 and 19 are provided within the terminal connection patterns 11 and 13, respectively.

Figure 7:
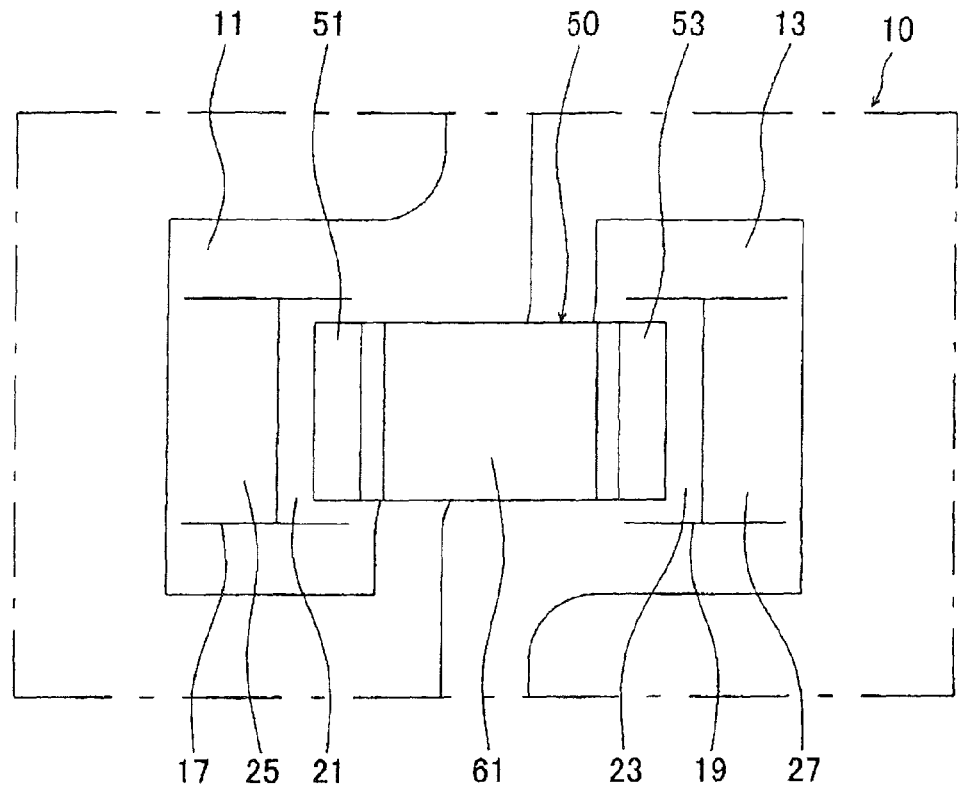
FIG. 7 is a plan view illustrating the production method for the mounting structure of the light-emitting component onto the flexible circuit board.
Figure 8:
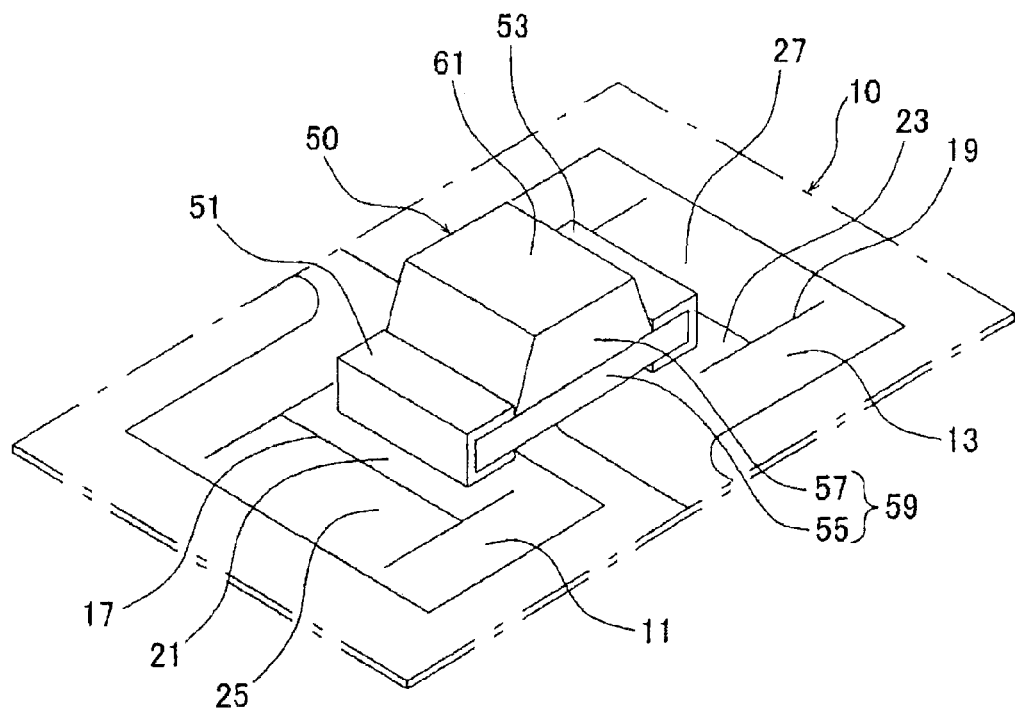
FIG. 8 is a perspective view illustrating the production method for the mounting structure of the light-emitting component onto the flexible circuit board.

Next, as shown in FIGS. 7 and 8, the light-emitting component 50 is placed on the flexible circuit board 10. At this time, the lower surfaces of the electrodes 51 and 53 of the light-emitting component 50 are brought into abutting contact with the terminal connection patterns 11 and 13, respectively, of the flexible circuit board 10. The light-emitting component 50 has a component body 59 in which a light-emitting element (not shown) is buried. The component body 59 is made of a synthetic resin material and consists essentially of a substantially rectangular base portion 55 and a trapezoidal projecting portion 57 provided on the center of the upper surface of the base portion 55. The upper surface of the projecting portion 57 is defined as a light-emitting part 61 that emits light. The light-emitting component 50 has electrodes 51 and 53 formed on the surfaces of the mutually opposing end portions of the base portion 55. The electrodes 51 and 53 are formed, for example, by applying gold plating to the surface of a thin film of copper or the like. The electrodes 51 and 53 extend from the lower surface to the upper surface through the associated outer side surfaces of the base portion 55.

Figure 9:
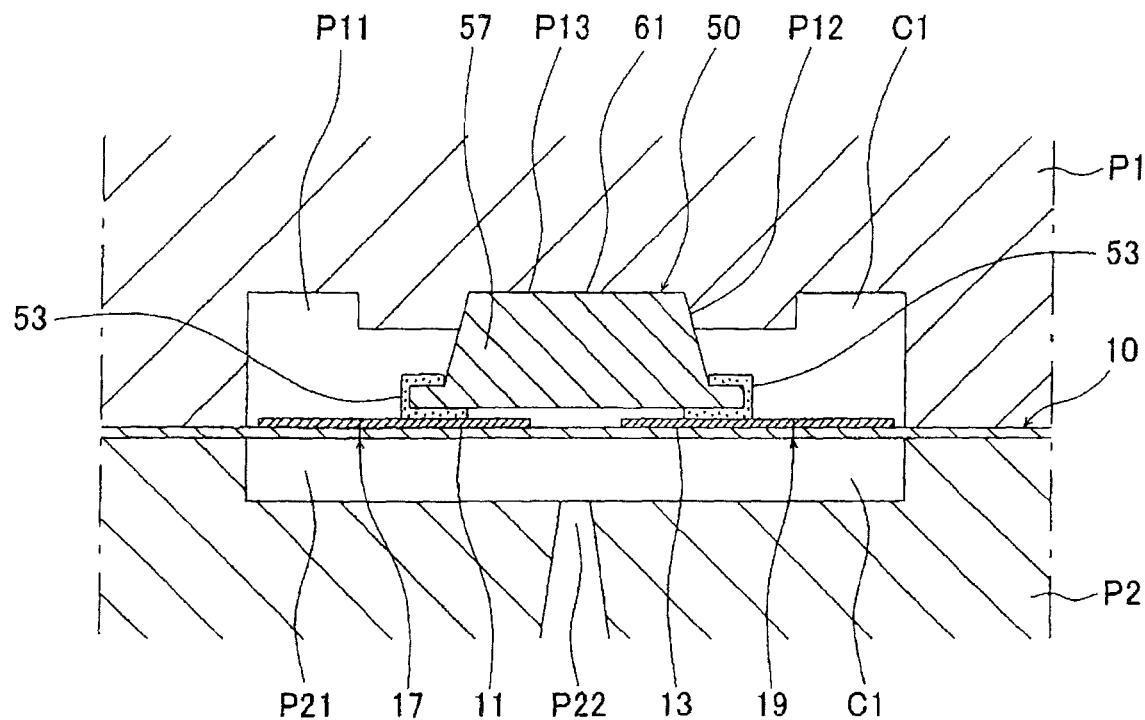
FIG. 9 is a schematic sectional view illustrating the production method for the mounting structure of the light-emitting component onto the flexible circuit board.

Next, as shown in FIG. 9, the flexible circuit board 10 and the light-emitting component 50 are set in a mold consisting essentially of first and second mold parts P1 and P2. The first and second mold parts P1 and P2 clamp the flexible circuit board 10 and, at the same time, forms a cavity C1 at a position enclosing the light-emitting component 50 and a portion of the flexible circuit board 10 surrounding the light-emitting component 50 placed thereon. The configuration of the cavity C1 is the same as that of the casing 80 (described below). The first mold part P1 has a substantially rectangular recess P11 that forms the cavity C1. The recess P11 is provided at the center thereof with a recess-shaped component insertion portion P12 into which the top of the projecting portion 57 of the light-emitting component 50 is inserted while effecting positioning. The bottom of the component insertion portion P12 serves as a component abutting portion P13 against which the top surface of the projecting portion 57, i.e. the surface of the light-emitting part 61, abuts. The second mold part P2 has a substantially rectangular recess P21 that forms the cavity C1. The recess P21 is provided at the center thereof with a resin injection port P22 for injecting a molten molding resin into the cavity C1. The resin injection port P22 is provided at a position facing the surface of the flexible circuit board 10 reverse to the surface thereof having the light-emitting component 50 placed thereon (i.e. at a position facing the center of the back of the light-emitting component 50).

Figure 10:
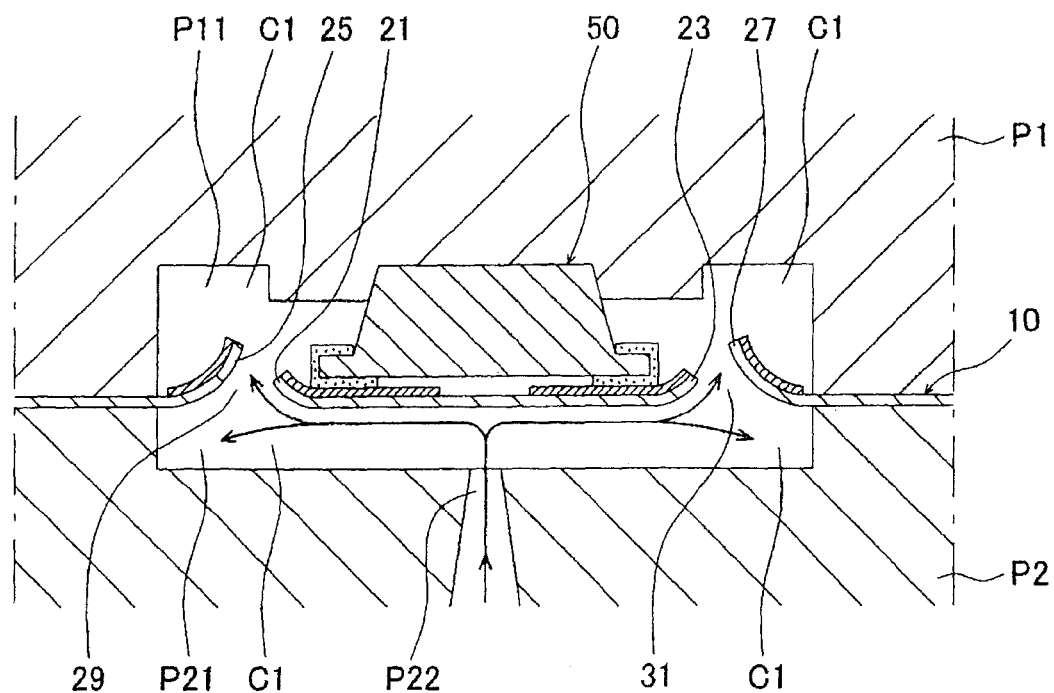
FIG. 10 is a schematic sectional view illustrating the production method for the mounting structure of the light-emitting component onto the flexible circuit board.
Figure 11:
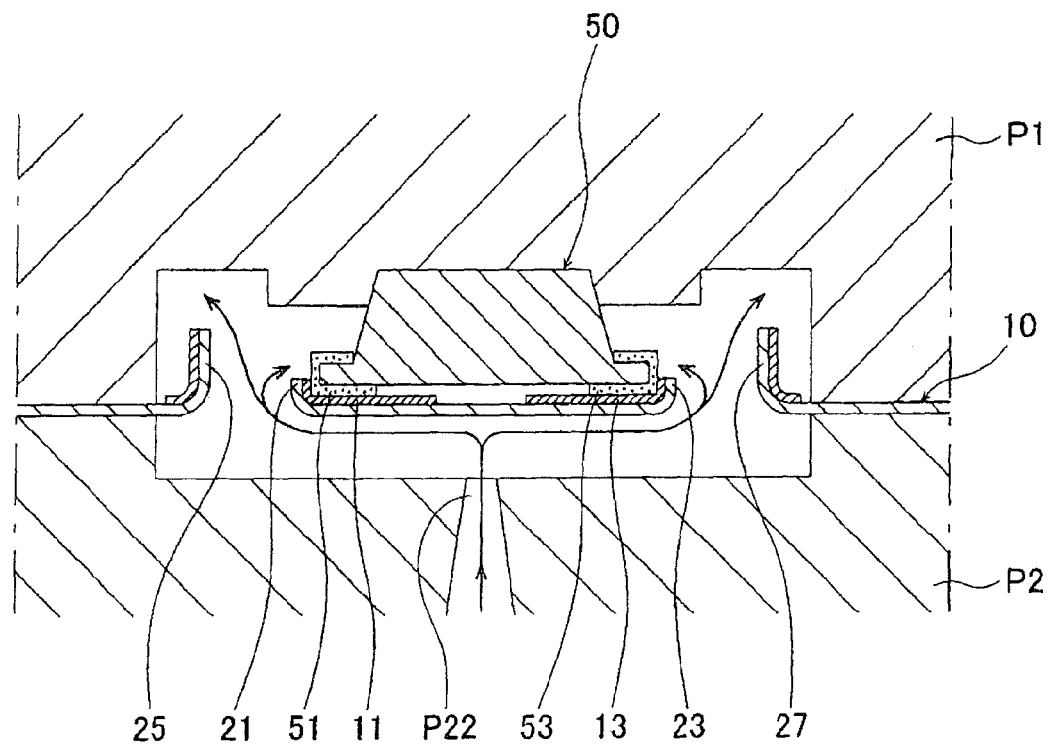
FIG. 11 is a schematic sectional view illustrating the production method for the mounting structure of the light-emitting component onto the flexible circuit board.

Then, as shown in FIG. 10, a high-temperature, high-pressure molten molding resin is injected into the cavity C1 (recess P21) of the second mold part P2 through the resin injection port P22. Examples of materials usable as the molten molding resin are a PBT resin, a POM resin, and an ABS resin. The molten molding resin may be transparent or opaque and have any color. These options can be chosen according to need. The temperature of the molten molding resin injected into the cavity C1 is in the range of from 230 to 260° C. in this embodiment. The temperature of the first and second mold parts P1 and P2 is about 60° C. The injected molten molding resin first flows toward the center of the surface of the flexible circuit board 10 reverse to the surface thereof having the light-emitting component 50 placed thereon. This causes the flexible circuit board 10 to be pressed against the light-emitting component 50. While the flexible circuit board 10 is being pressed against the light-emitting component 50 in this way, the cavity C1 (recess P21) of the second mold part P2 is filled with the molten molding resin. Further, the slits 17 and 19 of the flexible circuit board 10 are forced open as shown in FIG. 10, and the tongue-shaped side abutting portions 21 and 23 and the tongue-shaped board securing portions 25 and 27, which are portions of the flexible circuit board 10 at the peripheries of the slits 17 and 19, are forced to bend toward the recess P11 of the first mold part P1 (toward the side of the flexible circuit board 10 where the light-emitting component 50 is placed), and thus openings 29 and 31 are formed. Through the openings 29 and 31, the molten molding resin is also filled into the cavity C1 (recess P11) at the side of the flexible circuit board 10 where the light-emitting component 50 is placed. As shown in FIG. 11, the side abutting portions 21 and 23, which are the bent portions of the flexible circuit board 10, abut against both side surfaces of the light-emitting component 50 (i.e. the surfaces of the base portion 55 at its ends where the electrodes 51 and 53 are provided). In other words, the molten molding resin is injected so as to first flow toward the surface of the flexible circuit board 10 reverse to the surface thereof having the light-emitting component 50 placed thereon, thereby pressing the terminal connection patterns 11 and 13 of the flexible circuit board 10 against the electrodes 51 and 53 on the lower surface of the light-emitting component 50. While the flexible circuit board 10 is being pressed against the light-emitting component 50 in this way, the side abutting portions 21 and 23, which are portions of the flexible circuit board 10 at the peripheries of the slits 17 and 19, are forced to bend toward the side of the flexible circuit board 10 where the light-emitting component 50 is placed, and thus pressed against the electrodes 51 and 53 on the side surfaces of the light-emitting component 50. Thereafter, the molten molding resin fills the recess P11 of the first mold part P1. That is, the molten molding resin is filled into the cavity C1 while pressing the terminal connection patterns 11 and 13 against the electrodes 51 and 53. Therefore, no molten molding resin can enter between the terminal connection patterns 11 and 13 and the electrodes 51 and 53. Moreover, because the associated patterns are strongly pressed to contact each other by the molding resin, a reliable electrical connection can be made therebetween. Particularly, in this embodiment, the side abutting portions 21 and 23 are bent when the molten molding resin enters the slits 17 and 19, thereby blocking the molten molding resin from flowing around to the surface side of the terminal connection patterns 11 and 13. Therefore, no molten molding resin can enter the area of contact between the electrodes 51 and 53 provided on the lower surface of the light-emitting component 50 and the terminal connection patterns 11 and 13. Accordingly, a favorable and reliable connection can be made between them. Meanwhile, as shown in FIG. 11, the board securing portions 25 and 27, which are portions of the flexible circuit board 10, are also formed when the openings 29 and 31 are formed by forcing the board securing portions 25 and 27 to bend at substantially right angles toward the side of the flexible circuit board 10 where the light-emitting component 50 is placed. The board securing portions 25 and 27 are buried in the molten molding resin. After the molten molding resin has solidified, the first and second mold parts P1 and P2 are removed. Thus, the molding of the casing 80 as shown in FIGS. 1 to 4 is completed, and at the same time, the mounting of the light-emitting component 50 onto the flexible circuit board 10 is completed.

In the above-described embodiment, the side abutting portions 21 and 23, which are portions of the flexible circuit board 10, are bent to abut completely against the two side surfaces of the light-emitting component 50. It should be noted, however, that the bending angle of the side abutting portions 21 and 23 may be smaller than 90°. That is, the side abutting portions 21 and 23 do not necessarily need to completely abut against the side surfaces of the light-emitting component 50. That is, even if the bending angle of the side abutting portions 21 and 23, which are bent when the molten molding resin enters the slits 17 and 19, is insufficient so that the side abutting portions 21 and 23 cannot abut against the electrodes 51 and 53 on the side surfaces of the light-emitting component 50, the side abutting portions 21 and 23 bent when the molten molding resin enters the slits 17 and 19 can still block at least the molten molding resin from flowing around to the surface side of the terminal connection patterns 11 and 13. Therefore, it is possible to prevent at least the entry of the molten molding resin into the area of contact between the electrodes 51 and 53 provided on the lower surface of the light-emitting component 50 and the terminal connection patterns 11 and 13, so that the connection therebetween is ensured, as in the case of the above. As another example, there may be a case where the side abutting portions 21 and 23 are once pressed against the electrodes 51 and 53 on the side surfaces of the light-emitting component 50 by the entry of the molten molding resin into the slits 17 and 19 and thereafter separate slightly from the electrodes 51 and 53 as they spring back to their previous shape in a time period of 1 to 2 seconds needed for the molten molding resin to become solidified completely. Even in such a case, the molten molding resin can be blocked from flowing around to the surface side of the terminal connection patterns 11 and 13. Therefore, it is possible to prevent at least the entry of the molten molding resin into the area of contact between the electrodes 51 and 53 provided on the lower surface of the light-emitting component 50 and the terminal connection patterns 11 and 13, so that the connection therebetween is ensured.

As has been described above, the electronic component mounting structure according to this embodiment includes, as shown in FIGS. 1 to 4, the flexible circuit board 10 having the terminal connection patterns 11 and 13 formed thereon and the light-emitting component 50 provided with the electrodes 51 and 53. The light-emitting component 50 is placed on the flexible circuit board 10, and the synthetic resin casing 80 is provided by injection molding to cover the light-emitting component 50 and a portion of the flexible circuit board 10 surrounding the light-emitting component 50 placed thereon, whereby the electrodes 51 and 53 of the light-emitting component 50 and the terminal connection patterns 11 and 13 of the flexible circuit board 10 are connected in abutting contact with each other. That is, the light-emitting component 50 is mounted onto the flexible circuit board 10 by molding the casing 80. Accordingly, the mounting operation becomes efficient and can be automated and facilitated. The electronic component mounting structure is particularly effective when it is used to mount a plurality of light-emitting components 50 onto the flexible circuit board 10 by a single molding operation. In addition, according to this embodiment, the casing 80 is integrally molded to extend over the upper and lower sides of the flexible circuit board 10 through the openings 29 and 31 provided in the flexible circuit board 10 at the periphery of the light-emitting component 50 placed thereon. Therefore, the strength with which the light-emitting component 50 is secured to the flexible circuit board 10 by the casing 80 is increased.

In addition, according to the above-described embodiment, the casing 80 is molded such that the light-emitting part 61 of the light-emitting component 50 is exposed. Therefore, even if the light-emitting component 50 is mounted onto the flexible circuit board 10 by using the casing 80, the light-emitting part 61 of the light-emitting component 50 can be exposed to the outside. Thus, the amount of emitted light will not be reduced by the casing 80. According to the foregoing embodiment, the light-emitting component 50 is a surface-mount, so-called chip-type light-emitting component that has electrodes 51 and 53 formed on a surface thereof, and the flexible circuit board 10 is provided with the side abutting portions 21 and 23 outside the light-emitting component 50 placed thereon. The side abutting portions 21 and 23 are buried in the casing 80 in the state of being bent toward the side surfaces of the light-emitting component 50. Therefore, the surface-mount light-emitting component 50 can be mounted onto the flexible circuit board 10 even more reliably. Particularly, in this embodiment, the terminal connection patterns 11 and 13 on the bent side abutting portions 21 and 23 abut against the electrodes 51 and 53 provided on the side surfaces of the light-emitting component 50. Therefore, the electrical connection therebetween can be made even more reliable. In addition, according to the above-described embodiment, the board securing portions 25 and 27, which are buried in the casing 80, are provided at the respective peripheries of the openings 29 and 31 of the flexible circuit board 10 by bending the flexible circuit board 10 toward the side thereof where the light-emitting component 50 is placed. Therefore, the securing of the casing 80 to the flexible circuit board 10 becomes even more reliable and firmer. In addition, according to the foregoing embodiment, the electrodes 51 and 53 of the light-emitting component 50 and the terminal connection patterns 11 and 13 of the flexible circuit board 10 are connected in abutting contact with each other by the following steps: the step of placing the light-emitting component 50 on the flexible circuit board 10; the step of setting the flexible circuit board 10 and the light-emitting component 50 in the mold (first and second mold parts) P1 and P2; the step of injecting a molten molding resin into the cavity C1 in the mold P1 and P2 having the configuration of the casing 80 that is to be formed to enclose the light-emitting component 50 and a portion of the flexible circuit board 10 surrounding the light-emitting component 50 placed thereon; and the step of removing the mold P1 and P2 after the molten molding resin has solidified. Therefore, the mounting operation becomes efficient and can be automated and facilitated. The electronic component mounting method is particularly effective when it is used to mount a plurality of light-emitting components 50 onto the flexible circuit board 10 by a single molding operation. In addition, according to the above-described embodiment, the light-emitting component 50 placed on the flexible circuit board 10 is set in the mold P1 and P2 in such a manner that the surface of the light-emitting component 50 reverse to the surface thereof that is placed on the flexible circuit board 10 abuts against the inner surface of the first mold part P1 (i.e. the component abutting portion P13). In this state, the molten molding resin is injected toward the surface of the flexible circuit board 10 reverse to the surface thereof having the light-emitting component 50 placed thereon, thereby filling the molten molding resin also to the side of the flexible circuit board 10 where the light-emitting component 50 is placed through the openings 29 and 31 while pressing the flexible circuit board 10 against the light-emitting component 50. Therefore, the light-emitting component 50 can be mounted onto the flexible circuit board 10 even more reliably. Further, according to the foregoing embodiment, the slits 17 and 19 have previously been formed in the flexible circuit board 10 at the periphery of the light-emitting component 50 placed thereon, and the molten molding resin is injected toward the surface of the flexible circuit board 10 reverse to the surface thereof where the light-emitting component 50 is placed, whereby the flexible circuit board 10 is pressed against the light-emitting component 50 and, while doing so, portions of the flexible circuit board 10 at the respective peripheries of the slits 17 and 19 are forced to open toward the side of the flexible circuit board 10 where the light-emitting component 50 is placed, thereby forming the openings 29 and 31. Accordingly, the casing 80 can be molded in such a state that the terminal connection patterns 11 and 13 and the electrodes 51 and 53 are firmly and reliably connected to each other simply by placing the terminal connection patterns 11 and 13 and the electrodes 51 and 53 in abutting contact with each other even if solder or an electrically conductive adhesive is not used to connect and secure them to each other. According to the above-described embodiment, the openings 29 and 31 are formed by forcing open the portions of the flexible circuit board 10 at the peripheries of the slits 17 and 19, thereby providing the side abutting portions 21 and 23 outside the light-emitting component 50 placed on the flexible circuit board 10. The side abutting portions 21 and 23 are buried in the casing 80 in the state of being bent toward the side surfaces of the light-emitting component 50. Therefore, the molten resin for molding the casing 80 is prevented from entering between the terminal connection patterns 11 and 13 and the electrodes 51 and 53. In addition, according to the foregoing embodiment, the board securing portions 25 and 27 are provided as a result of formation of the openings 29 and 31 by forcing open the portions of the flexible circuit board 10 at the peripheries of the slits 17 and 19. The board securing portions 25 and 27 are buried in the casing 80 in the state of being bent toward the side of the flexible circuit board 10 where the light-emitting component 50 is placed. Therefore, the board securing portions 25 and 27, which are formed by bending the flexible circuit board 10, can be readily buried in the casing 80. The board securing portions 25 and 27 enable the casing 80 to be secured to the flexible circuit board 10 even more reliably and firmly.

It should be noted that in this embodiment only the light-emitting part 61 provided on the light-emitting component 50 is exposed from the casing 80, and hence the electrodes 51 and 53 provided on the light-emitting component 50 are covered with the casing 80. Accordingly, static electricity that might enter the casing 80 from above (from the light-emitting part 61 side of the light-emitting component 50) cannot enter the electrodes 51 and 53. In other words, the casing 80 serves also as a member that prevents entry of static electricity into the electrodes 51 and 53 of the light-emitting component 50.

Second Embodiment

Figure 12:
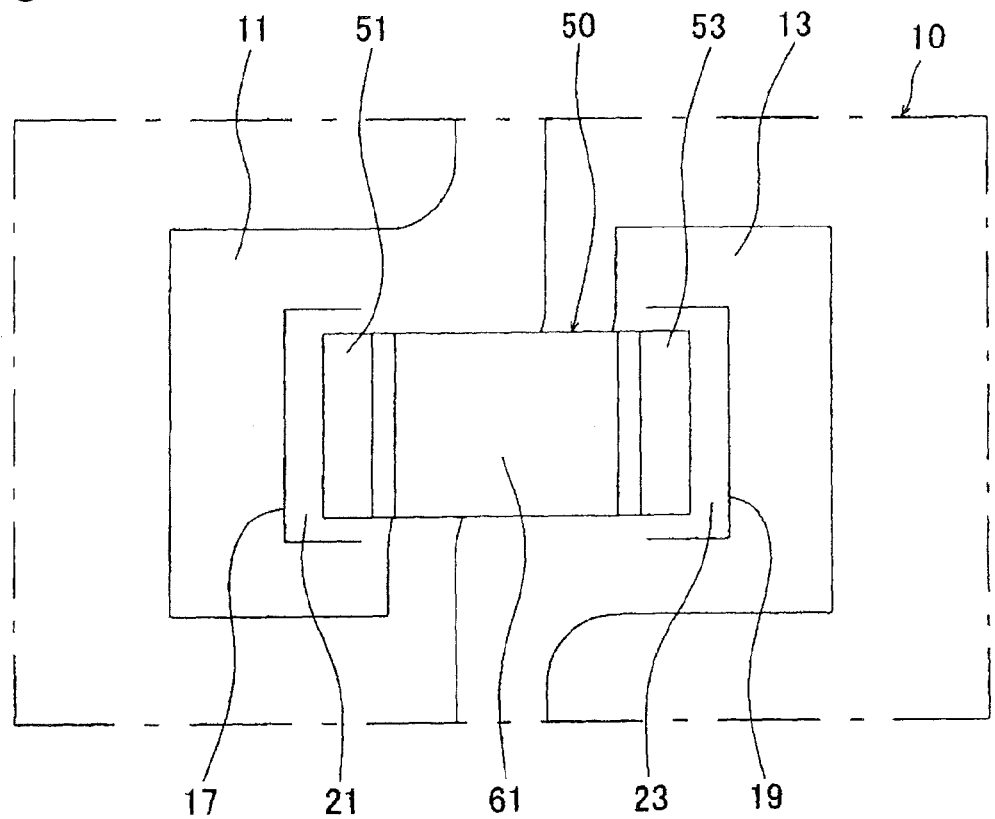
FIG. 12 is a plan view illustrating a production method for a mounting structure of an electronic component onto a circuit board according to a second embodiment of the present invention.

FIG. 12 is a schematic diagram illustrating a production method for a mounting structure of an electronic component onto a circuit board according to a second embodiment of the present invention. FIG. 12 is equivalent to FIG. 7 illustrating the foregoing embodiment. In FIG. 12, portions identical or equivalent to those in the embodiment shown in FIGS. 1 to 11 are denoted by the same reference symbols as those in the first embodiment (the same is the case with the following other embodiments). It should be noted that the matters in the second embodiment other than those explained below are the same as in the embodiment shown in FIGS. 1 to 11 (the same is the case with the following other embodiments). The second embodiment differs from the embodiment shown in FIGS. 1 to 11 only in that only the tongue-shaped side abutting portions 21 and 23 are provided at the mutually opposing inner sides of the two slits 17 and 19 by altering the configuration of the slits 17 and 19, but board securing portions such as those in the embodiment shown in FIGS. 1 to 11 are not formed at the mutually opposing outer sides of the slits 17 and 19. With this arrangement, the advantageous effects offered by the board securing portions cannot be obtained, but it is possible to similarly achieve all the other advantageous effects stated in connection with the embodiment shown in FIGS. 1 to 11.

Third Embodiment

Figure 13:
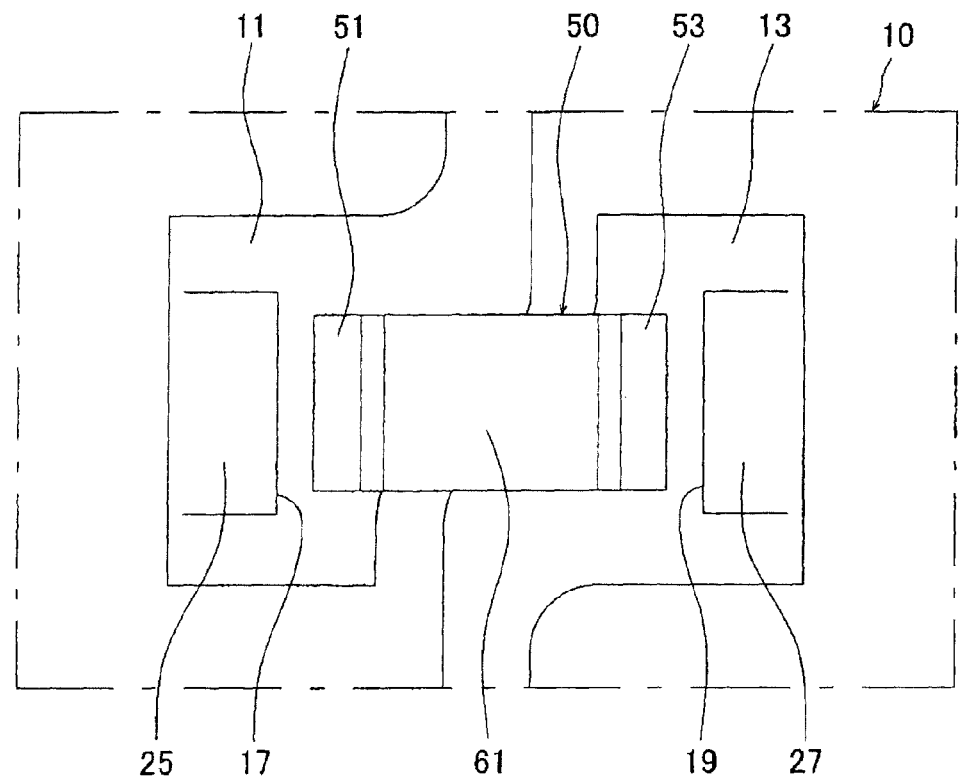
FIG. 13 is a plan view illustrating a production method for a mounting structure of an electronic component onto a circuit board according to a third embodiment of the present invention.

FIG. 13 is a schematic diagram illustrating a production method for a mounting structure of an electronic component onto a circuit board according to a third embodiment of the present invention. FIG. 13 is equivalent to FIG. 7 illustrating the foregoing embodiment. The third embodiment differs from the embodiment shown in FIGS. 1 to 11 only in that only the tongue-shaped board securing portions 25 and 27 are provided at the mutually opposing outer sides of the two slits 17 and 19 by altering the configuration of the slits 17 and 19, but side abutting portions such as those in the embodiment shown in FIGS. 1 to 11 are not formed at the mutually opposing inner sides of the slits 17 and 19. With this arrangement, the advantageous effects offered by the side abutting portions cannot be obtained, but it is possible to similarly achieve all the other advantageous effects stated in connection with the embodiment shown in FIGS. 1 to 11.

Fourth Embodiment

Figure 14:
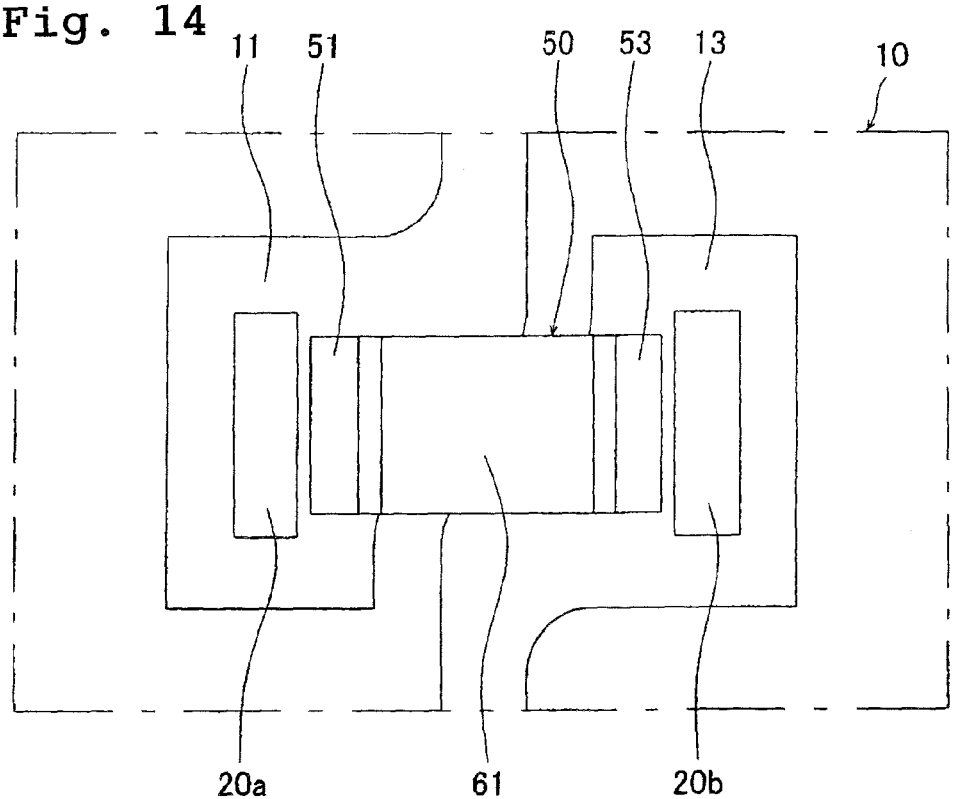
FIG. 14 is a plan view illustrating a production method for a mounting structure of an electronic component onto a circuit board according to a fourth embodiment of the present invention.

FIG. 14 is a schematic diagram illustrating a production method for a mounting structure of an electronic component onto a circuit board according to a fourth embodiment of the present invention. FIG. 14 is equivalent to FIG. 7 illustrating the foregoing embodiment. The fourth embodiment differs from the embodiment shown in FIGS. 1 to 11 only in that, in place of the slits 17 and 19, only rectangular, vertically through-extending openings 20a and 20b are provided at where the slits 17 and 19 are provided in the foregoing embodiment. With this arrangement, the advantageous effects offered by the side abutting portions and the board securing portions as in the embodiment shown in FIGS. 1 to 11 cannot be obtained, but it is possible to similarly achieve all the other advantageous effects stated in connection with the embodiment shown in FIGS. 1 to 11.

Fifth Embodiment

Figure 15:
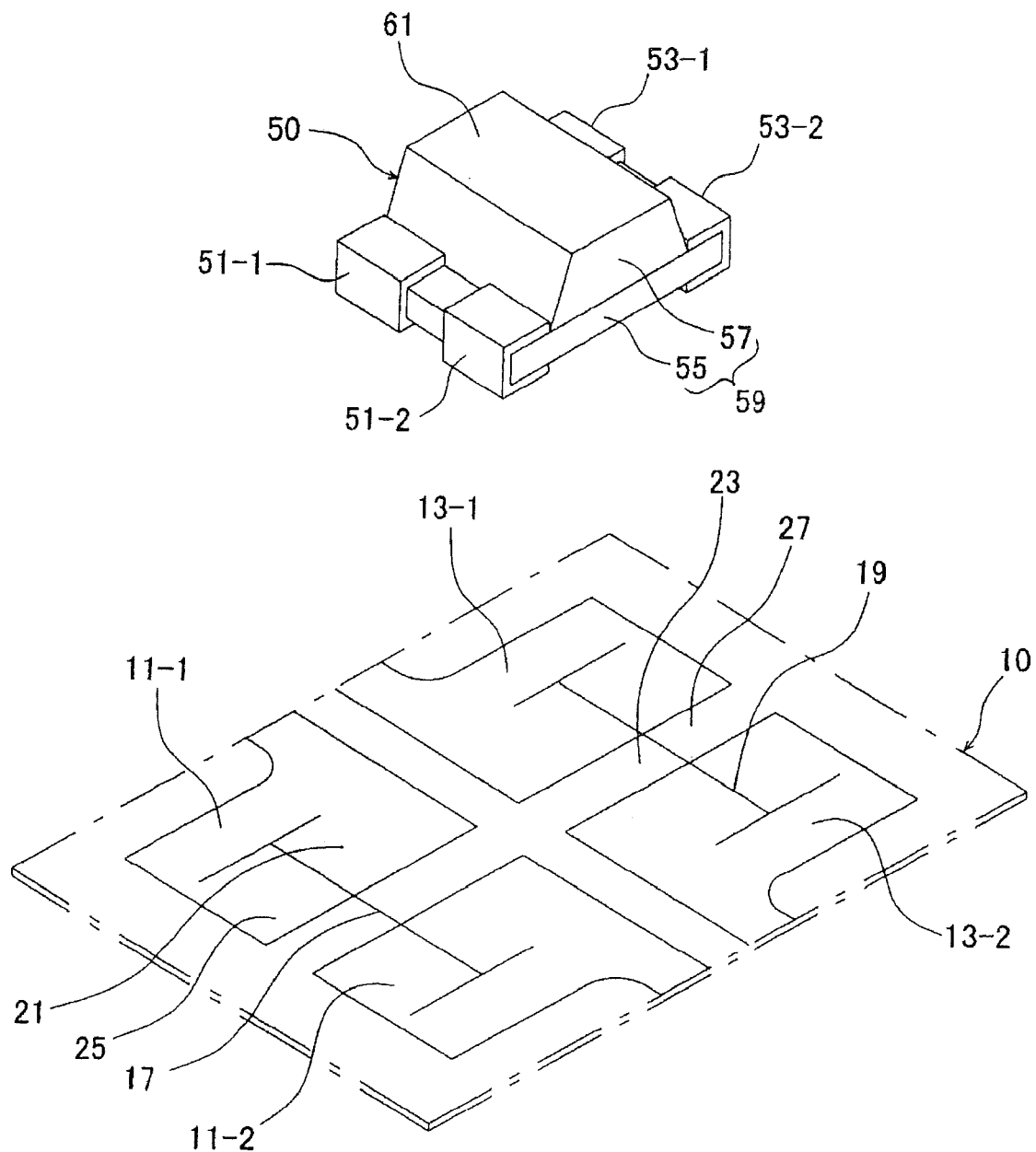
FIG. 15 is a perspective view illustrating a production method for a mounting structure of an electronic component onto a circuit board according to a fifth embodiment of the present invention.

FIG. 15 is a perspective view illustrating a production method for a mounting structure of an electronic component onto a circuit board according to a fifth embodiment of the present invention. FIG. 15 shows a flexible circuit board 10 and a light-emitting component 50 that are used in the fifth embodiment. This embodiment differs from the embodiment shown in FIGS. 1 to 11 only in that the light-emitting component 50 is provided with four electrodes 51-1, 51-2, 53-1 and 53-2 on the four corners of the base portion 55, and four terminal connection patterns 11-1, 11-2, 13-1 and 13-2 are formed on the flexible circuit board 10 in correspondence to the four electrodes 51-1, 51-2, 53-1 and 53-2. With this arrangement, even if there is a change in number or position of electrodes on the light-emitting component 50, it is possible to readily cope with the change in number or position of electrodes. It should be noted that this embodiment can similarly achieve all the advantageous effects stated in connection with the embodiment shown in FIGS. 1 to 11.

Sixth Embodiment

Figure 16:
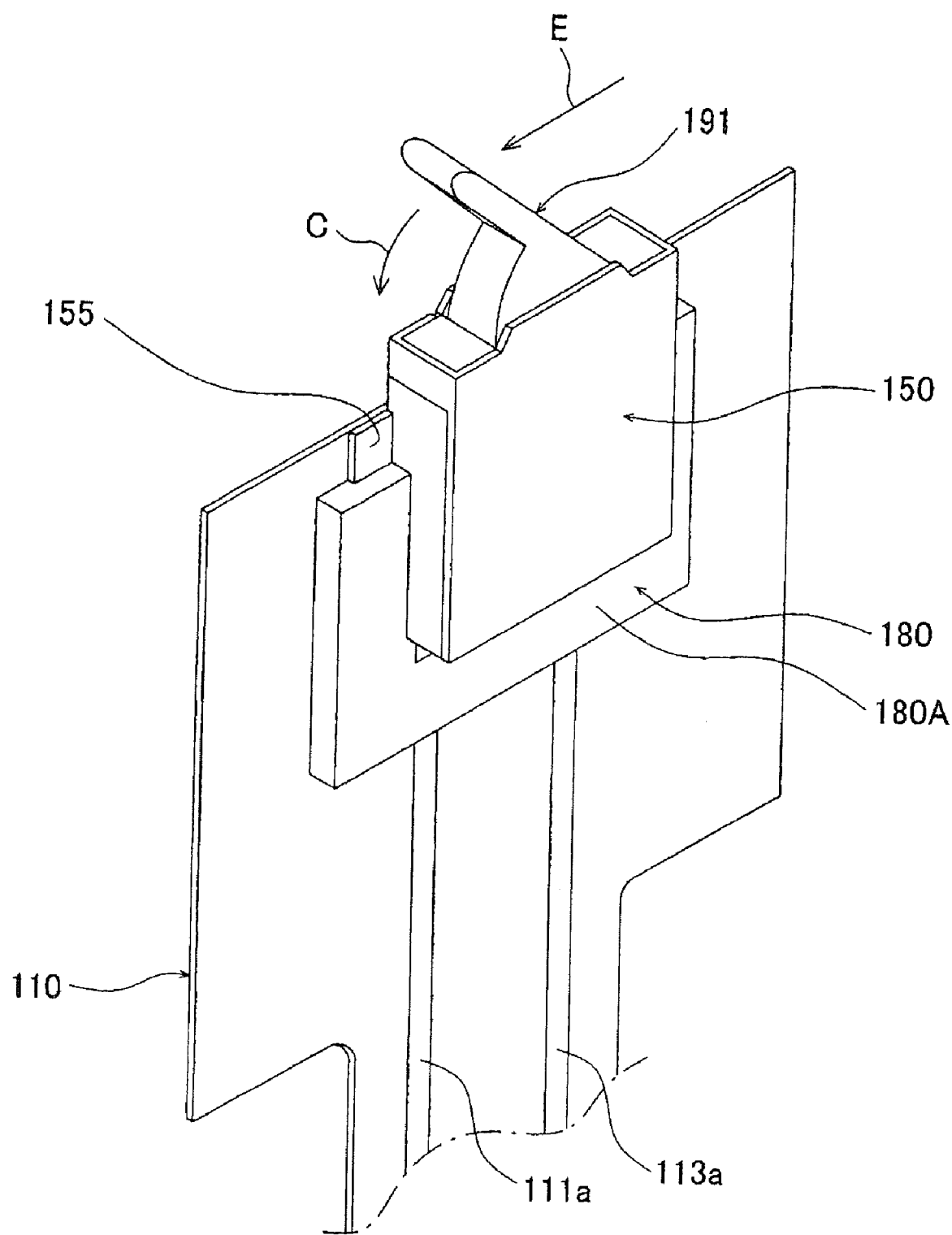
FIG. 16 is a perspective view of a mounting structure of a sensor switch onto a flexible circuit board according to a sixth embodiment of the present invention as seen from one side (front side) thereof.
Figure 17:
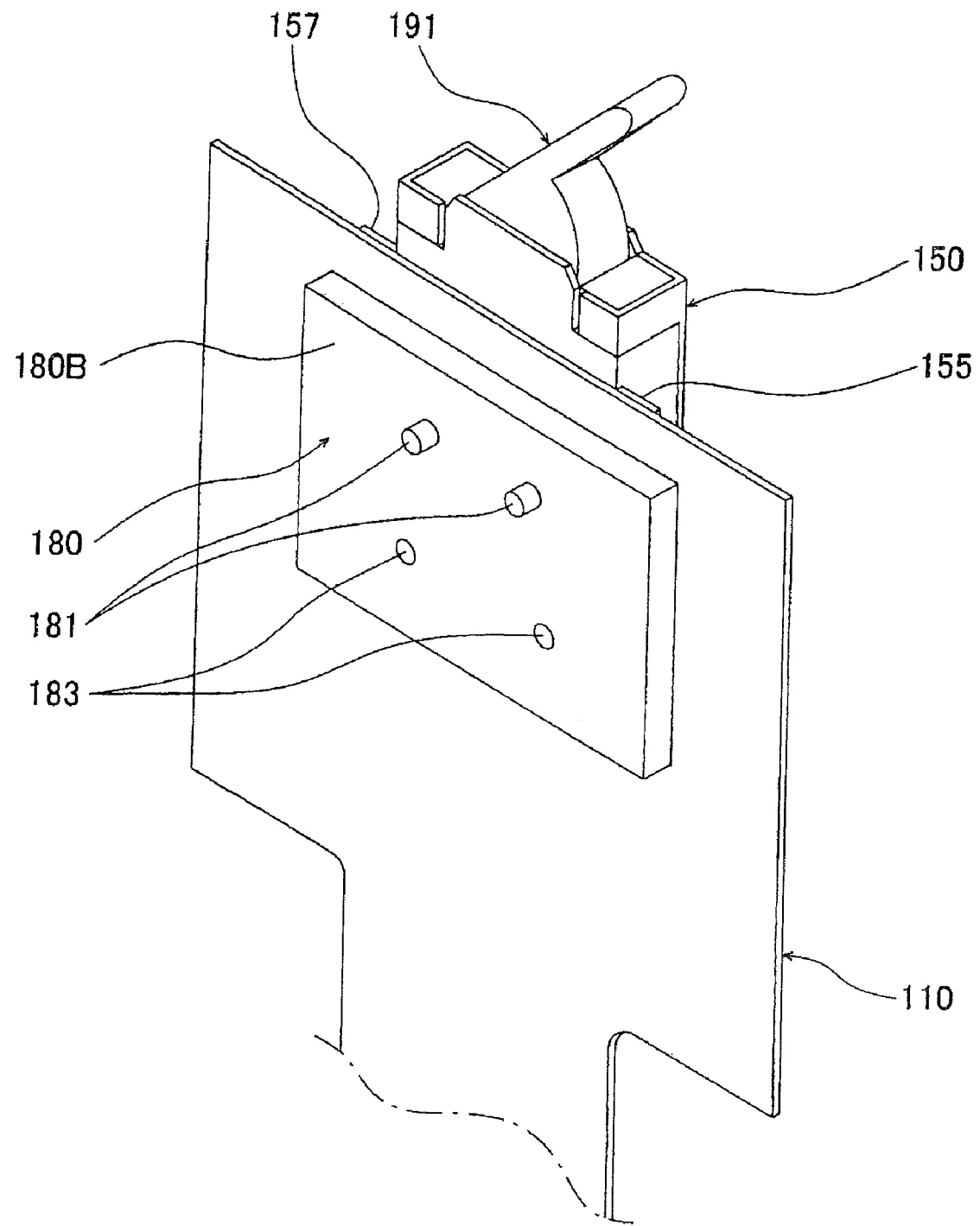
FIG. 17 is a perspective view of the mounting structure of the sensor switch onto the flexible circuit board as seen from the other side (rear side) thereof.
Figure 18:
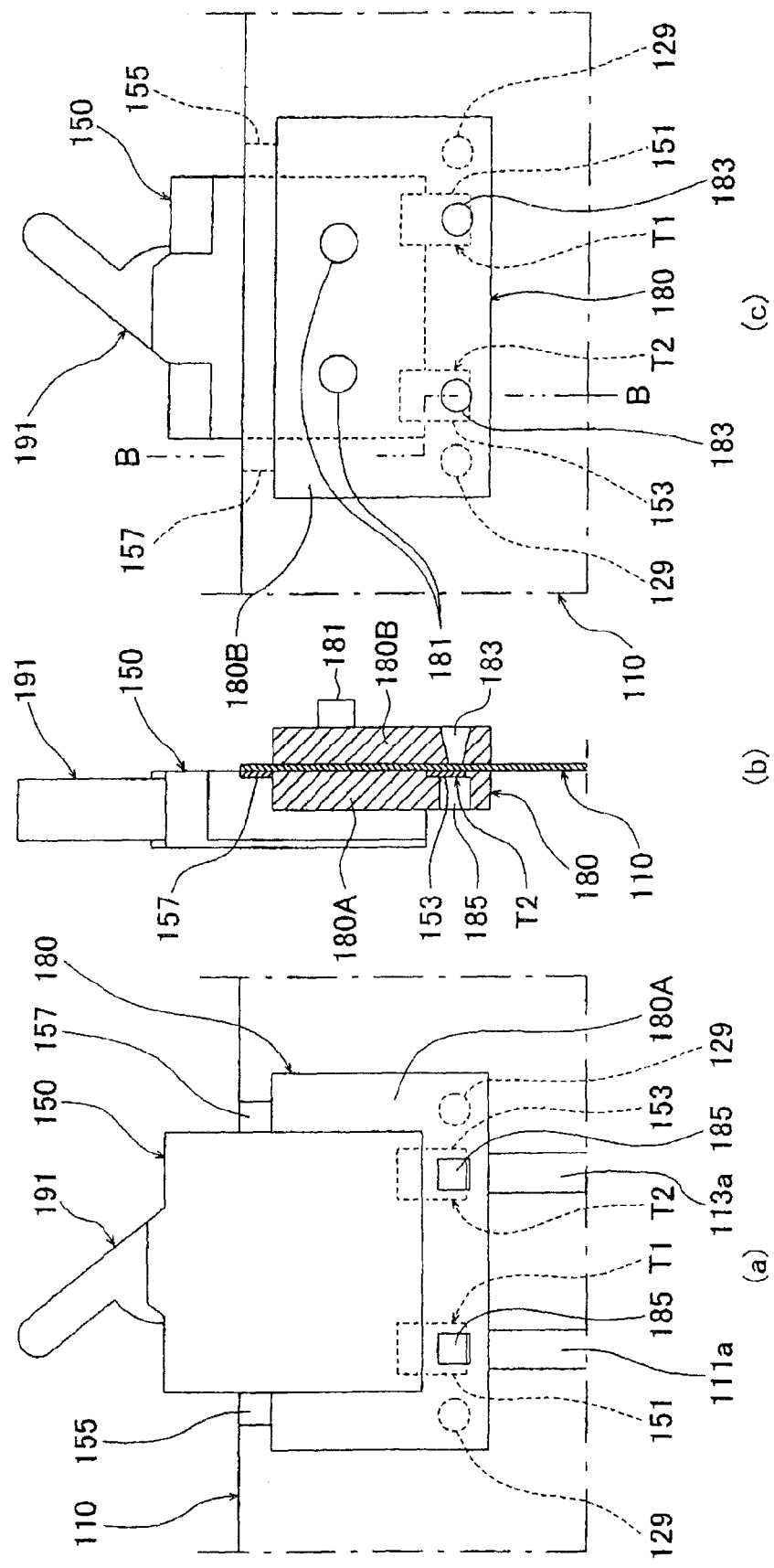
FIG. 18(*a*) is a front view of the electronic component mounting structure according to the sixth embodiment of the present invention.

FIGS. 16 to 18 are diagrams showing a mounting structure of an electronic component onto a circuit board according to a sixth embodiment of the present invention. FIG. 16 is a perspective view of a circuit board (hereinafter in this embodiment referred to as "flexible circuit board") 110 as seen from one side (front side) thereof. FIG. 17 is a perspective view of the flexible circuit board 110 as seen from the other side (rear side) thereof. FIG. 18(a) is a front view. FIG. 18(b) is a schematic sectional side view [taken along the line B-B in FIG. 18(c)]. FIG. 18(c) is a rear view. As shown in these figures, the electronic component mounting structure according to this embodiment includes a flexible circuit board 110 having a pair of terminal connection patterns 111 and 113 (see FIG. 19) formed thereon and an electronic component (hereinafter in this embodiment referred to as "sensor switch") 150 provided with a pair of terminals (hereinafter in this embodiment referred to as "terminal plates") 151 and 153 (see FIG. 21). The sensor switch 150 is placed on the flexible circuit board 110, and a synthetic resin casing 180 is provided by injection molding to cover the sensor switch 150 and a portion of the flexible circuit board 110 surrounding the sensor switch 150 placed thereon, whereby the terminal plates 151 and 153 projecting from the sensor switch 150 and the terminal connection patterns 111 and 113 on the flexible circuit board 110 are connected in abutting contact with each other. These constituent parts will be explained with regard to their configurations, structures and materials, together with a production method therefor.

Figure 19:
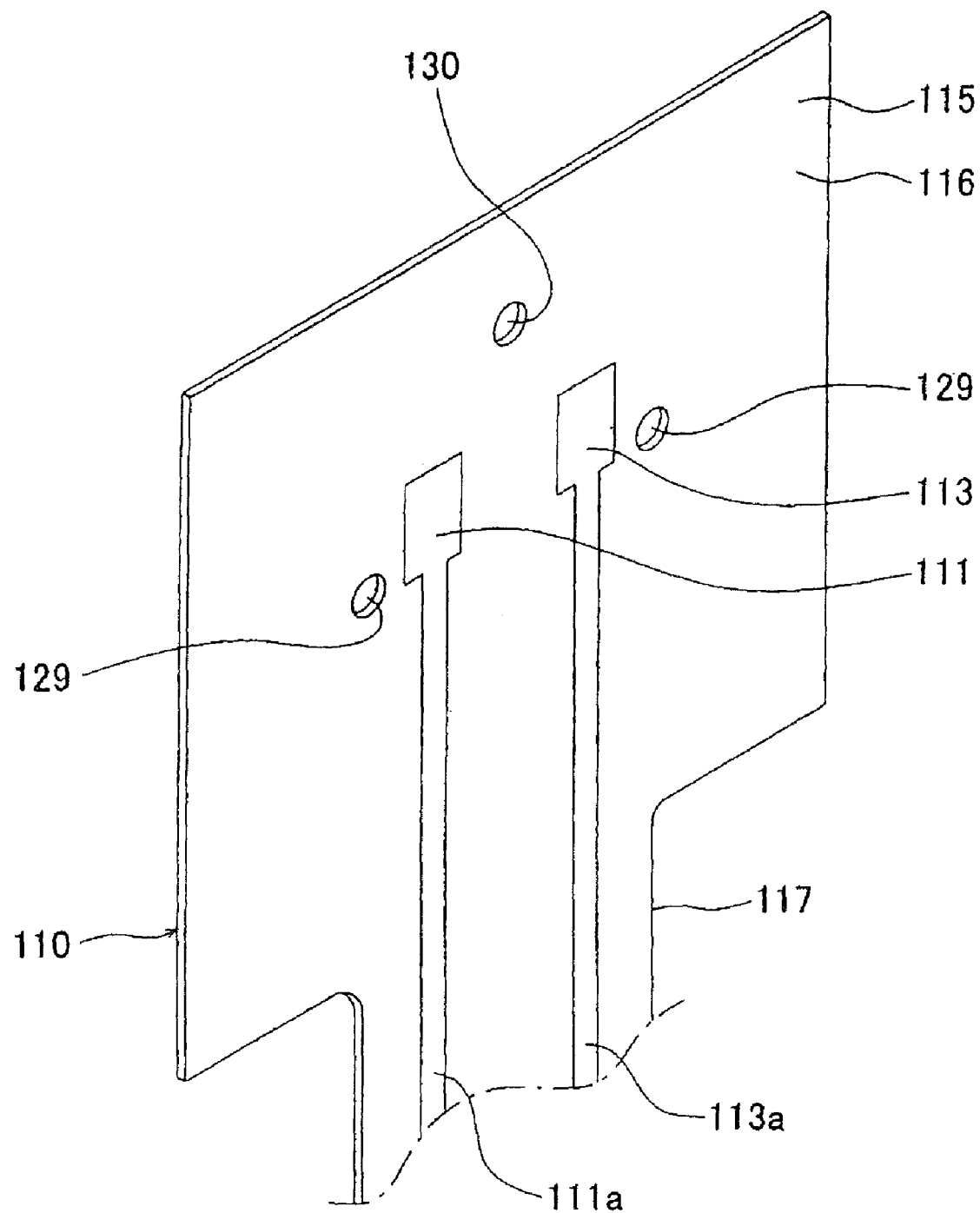
FIG. 19 is a perspective view of the flexible circuit board as seen from one side thereof.

As shown in FIG. 19, a flexible circuit board 110 is prepared. The flexible circuit board 110 is a flexible synthetic resin film 115 having a surface 116 on which a sensor switch 150 is to be placed. The flexible circuit board 110 has a pair of substantially rectangular terminal connection patterns 111 and 113 provided on the surface 116. Circuit patterns 111a and 113a are connected to the terminal connection patterns 111 and 113, respectively. The synthetic resin film 115 may be either a thermoplastic synthetic resin film or a thermosetting synthetic resin film. Examples of usable synthetic resin films are polyphenylene sulfide (PPS) film, polyimide (PI) film, polyethylene terephthalate (PET) film, polyethylene naphthalate (PEN) film, and polyether imide (PEI) film. In this embodiment, a PET film is used. The terminal connection patterns 111 and 113 and the circuit patterns 111a and 113a may be formed on the synthetic resin film 115 by using various printing techniques, e.g. screen printing. It is also possible to form them by etching copper foil applied to the surface of the synthetic resin film 115 or by vapor deposition, e.g. sputtering. In this embodiment, the terminal connection patterns 111 and 113 and the circuit patterns 111a and 113a are formed by screen printing using an electrically conductive paste that is prepared by mixing a metal powder (e.g. silver powder) with a resin binder (e.g. a mixture of a urethane resin with a solvent). The terminal connection patterns 111 and 113 are provided at respective positions where they are connected to the terminal plates 151 and 153 of the sensor switch 150 (described below). In this embodiment, the circuit patterns 111a and 113a are led toward a belt-shaped lead portion 117 provided on the lower side of the flexible circuit board 110. The flexible circuit board 110 has a plurality (2 in this embodiment) of circular through-extending openings 129 provided at the periphery of the portion thereof where the terminal connection patterns 111 and 113 are provided (in this embodiment the openings 129 are provided at the respective outsides of the terminal connection patterns 111 and 113). The flexible circuit board 110 further has one circular through-extending positioning hole 130 provided at the periphery of the portion thereof provided with the terminal connection patterns 111 and 113 (in this embodiment the positioning hole 130 is provided at the center of the upper side of the terminal connection patterns 111 and 113). The openings 129 are formed in the peripheral portion of a surface of the flexible circuit board 110 that is to be brought into abutting contact with the sensor switch 150 (described below) that is to be placed on the flexible circuit board 110.

Figure 20:
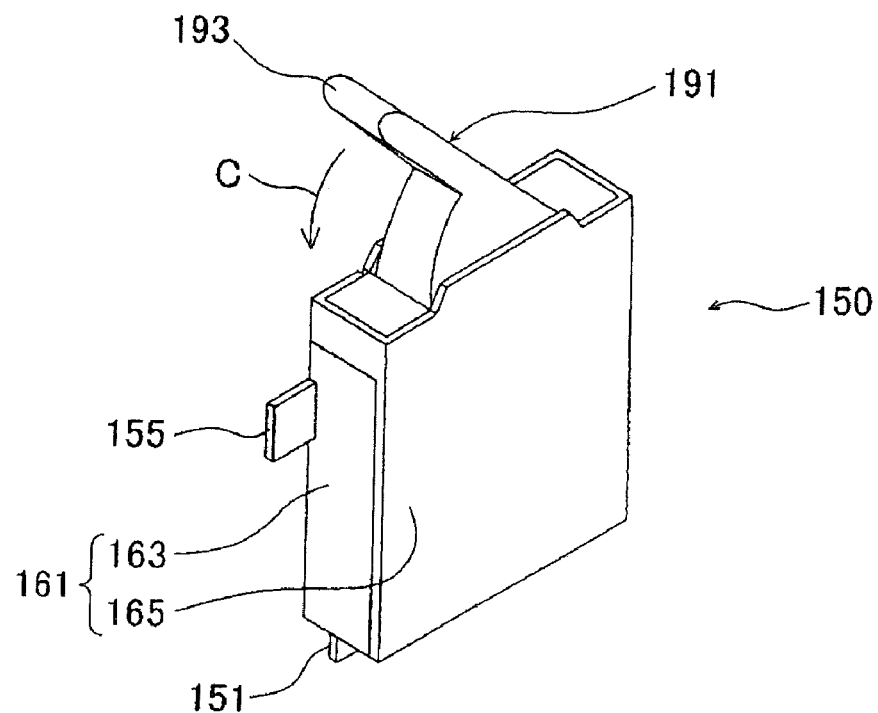
FIG. 20 is a perspective view of the sensor switch as seen from one side thereof.
Figure 21:
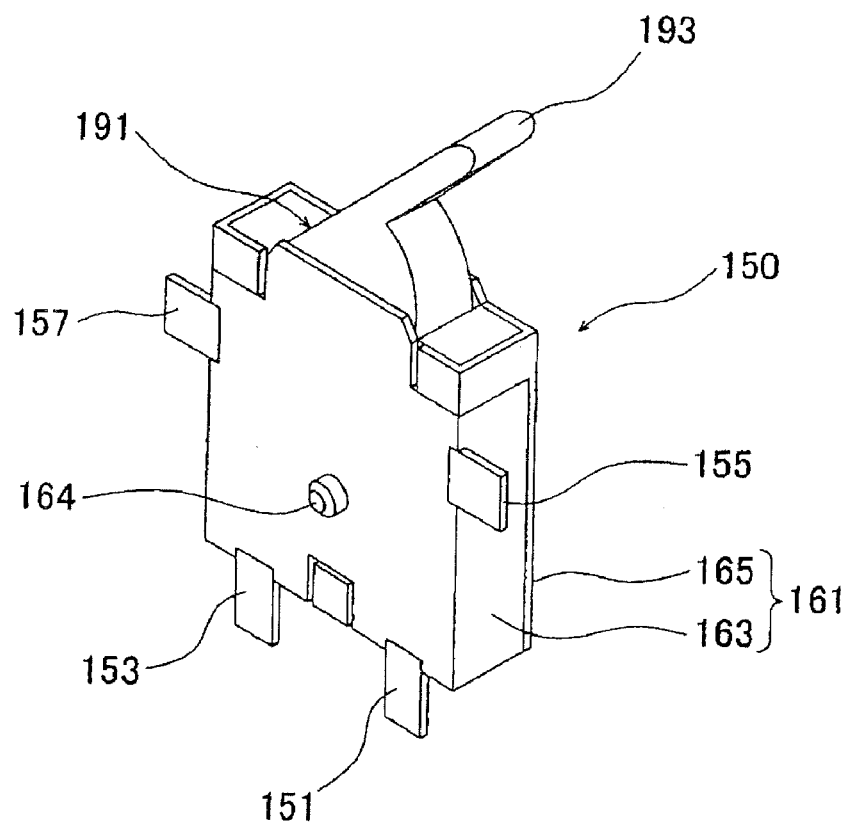
FIG. 21 is a perspective view of the sensor switch as seen from the other side thereof.

FIG. 20 is a perspective view of the sensor switch 150 as seen from one side (front side) thereof. FIG. 21 is a perspective view of the sensor switch 150 as seen from the other side (rear side) thereof. As shown in these figures, the sensor switch 150 has a pivoting lever 191 projecting from the upper surface of a rectangular electronic component body 161. When a moving member (not shown) abuts against the pivoting lever 191 from the direction of the arrow E shown in FIG. 16, the pivoting lever 191 pivots in the direction of the arrow C, causing a change in the ON/OFF output of the sensor switch 150, thereby detecting the travel position of the moving member. The electronic component body 161 comprises a rectangular synthetic resin casing body 163 provided therein with a housing portion, and a rectangular cover 165 made of a metal plate and attached to the casing body 163 to cover the housing portion thereof. The housing portion of the casing body 163 pivotably houses the proximal portion of the pivoting lever 191. Pivoting movement of the pivoting lever 191 causes a change in the electric output (ON/OFF output) of an electric functional part installed in the electronic component body 161. The electric functional part comprises a sliding member (not shown) attached to the proximal portion of the pivoting lever 191 and a switch pattern (not shown) provided in the electronic component body 161. A pair of metallic terminal plates 151 and 153 project outward (downward) from the downward-facing side of the electronic component body 161 (more specifically, the casing body 163). The ON/OFF state between the terminal plates 151 and 153 switches over in accordance with the pivoting position of the pivoting lever 191. A pair of retainers 155 and 157 each made of a metal plate project outward from the left and right side surfaces of the electronic component body 161 (more specifically, the casing body 163). The rear surfaces of the terminal plates 151 and 153 and the retainers 155 and 157 are all flush with the rear surface of the electronic component body 161 (more specifically, the casing body 163). In other words, the sensor switch 150 is of the surface-mount type in which the rear surface of the electronic component body 161 is used as a surface that is placed on the circuit board. In addition, a positioning projection 164 is provided at substantially the center of the rear surface of the casing body 163. The positioning projection 164 is inserted into the positioning hole 130 of the flexible circuit board 110 to position the sensor switch 150. The pivoting lever 191 has a lever portion 193 projecting obliquely upward from the upper side surface of the electronic component body 161. The position of the pivoting lever 191 shown in FIG. 20 is a stationary position thereof. Pivoting the lever portion 193 shown in FIG. 20 in a direction in which it tilts further downward (i.e. in the direction of the arrow C) causes a change in the ON/OFF output of the sensor switch 150. The lever portion 193 tilted downward is automatically returned to the previous stationary position by a resilient means installed in the electronic component body 161.

Figure 22:
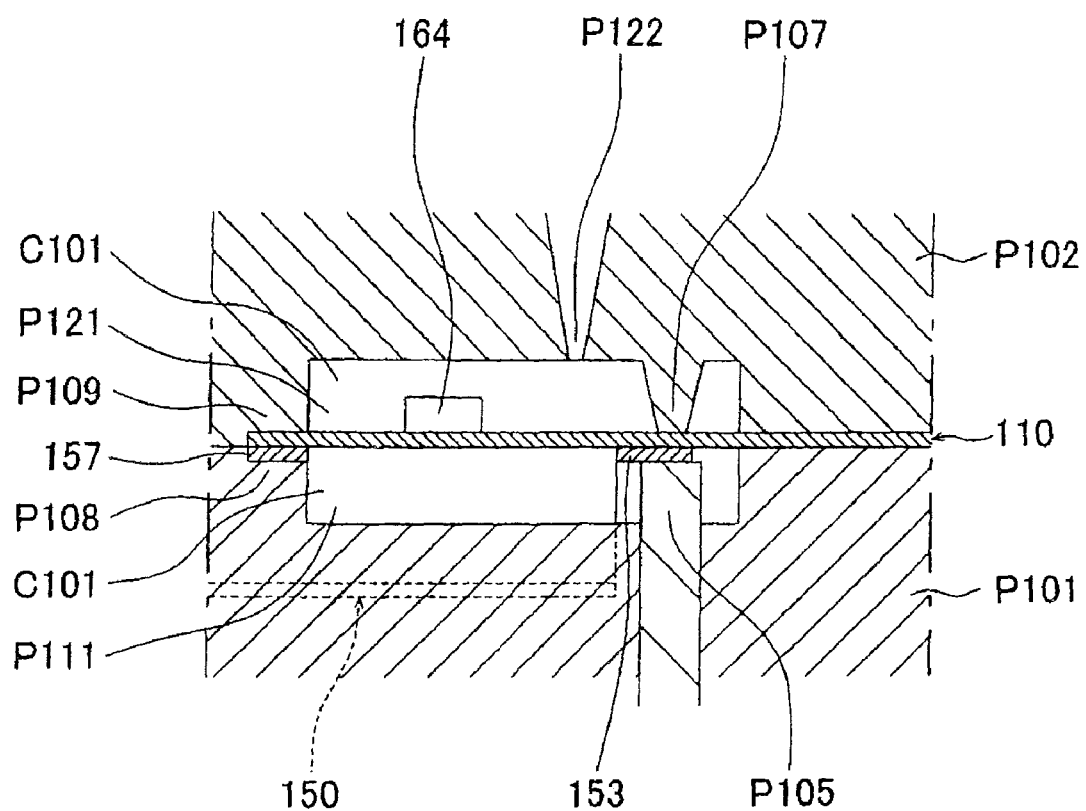
FIG. 22 is a schematic sectional view illustrating a production method for the mounting structure of the sensor switch onto the flexible circuit board.

The sensor switch 150 is mounted onto the flexible circuit board 110 by the casing 180 as follows. First, as shown in FIG. 22, the flexible circuit board 110 and the sensor switch 150 are set in a mold consisting essentially of first and second mold parts P101 and P102. It should be noted that FIG. 22 is a fragmentary schematic sectional side view taken along the same line as in the case of the sectional view of FIG. 18(*b*). FIG. 22 shows the sensor switch 150 and the flexible circuit board 110 that are clamped with the first and second mold parts P101 and P102. At this time, the sensor switch 150 is placed (to abut against) on the flexible circuit board 110 (on the lower surface thereof as viewed in FIG. 22). The respective surfaces of the terminal plates 151 and 153 of the sensor switch 150 are brought into abutting contact with the terminal connection patterns 111 and 113 on the flexible circuit board 110. At the same time, the positioning projection 164 of the sensor switch 150 is inserted into the positioning hole 130 of the flexible circuit board 110 to position the sensor switch 150.

The first and second mold parts P101 and P102 clamp the flexible circuit board 110 therebetween and, at the same time, forms a cavity C101 at a position enclosing the sensor switch 150 and a portion of the flexible circuit board 110 surrounding the sensor switch 150 placed thereon. The configuration of the cavity C1 is the same as that of the casing 180 (described below). More specifically, the first mold part P101 has a recess P111 that forms the cavity C101. The recess P111 is formed with a smaller thickness than that of the sensor switch 150 at a position enclosing three outer peripheral side surfaces of the lower portion of the sensor switch 150 (i.e. the portion of the sensor switch 150 opposite to the side thereof from which the lever portion 193 projects) placed in the mold. The second mold part P102 has a substantially rectangular recess P121 that forms the cavity C101. The recess P121 is provided at the center thereof with a resin injection port P122 for injecting a molten molding resin into the cavity C101. The resin injection port P122 is provided at a position facing the surface of the flexible circuit board 110 opposite to the surface thereof against which the sensor switch 150 abuts. The terminal plates 151 and 153 of the sensor switch 150 and the portions of the flexible circuit board 110 provided with the terminal connection patterns 111 and 113 that are in abutting contact with the terminal plates 151 and 153 are clamped from both sides thereof with bar-shaped pressing portions P105 projecting into the cavity C101 in the first mold part P101 and pressing portions P107 projecting into the cavity C101 in the second mold part P102. The pressing portions P105 provided in the first mold part P101 are prepared as component parts separate from the first mold part P101 and placed to project into the cavity C101 from the first mold part P101 so that the pressing portions P105 can cooperate with the pressing portions P107 to clamp the terminal plates 151 and 153 and the flexible circuit board 110 with a predetermined load. At the same time, the retainers 155 and 157 of the sensor switch 150 and the portions of the flexible circuit board 110 against which the retainers 155 and 157 abut are clamped with retaining portions P108 and P109 respectively formed on the first and second mold parts P101 and P102 outside the cavity C101.

In other words, when the flexible circuit board 110 and the sensor switch 150 are set in the mold (first and second mold parts P101 and P102), the portions where the terminal plates 151 and 153 and the terminal connection patterns 111 and 113 of the flexible circuit board 110 abut against each other are clamped from both sides thereof with the pairs of pressing portions P105 and P107 provided in the cavity C101. Meanwhile, when the flexible circuit board 110 and the sensor switch 150 are set in the mold, the portions where the retainers 155 and 157 and the flexible circuit board 110 abut against each other outside the cavity C101 are clamped from both sides thereof with the pairs of retaining portions P108 and P109 provided on the mold. Thus, the electric connection between the terminal plates 151 and 153 and the terminal connection patterns 111 and 113 can be made reliably. In addition, because the flexible circuit board 110 and the sensor switch 150 are secured at four points, there will be no displacement of the set positions of these members even if a molten molding resin is injected into the cavity C101 in the subsequent process.

Then, a high-temperature, high-pressure molten molding resin is injected into the cavity C101 (recess P121) of the second mold part P102 through the resin injection port P122. Examples of materials usable as the molten molding resin are a PBT resin, a POM resin, and an ABS resin. The temperature of the molten molding resin injected into the cavity C101 is in the range of from 230 to 260° C. in this embodiment. The temperature of the first and second mold parts P101 and P102 is about 60° C. The injected molten molding resin first flows toward the surface of the flexible circuit board 110 opposite to the surface thereof against which the sensor switch 150 abuts. This causes the flexible circuit board 110 to be pressed against the sensor switch 150. While the flexible circuit board 110 is being pressed against the sensor switch 150 in this way, the cavity C101 (recess P121) of the second mold part P102 is filled with the molten molding resin. Further, through the openings 129 provided in the flexible circuit board 110, the molten molding resin is also filled into the cavity C101 (recess P111) at the side of the flexible circuit board 110 where the sensor switch 150 is placed. In other words, the molten molding resin is filled into the cavity C101 while pressing the flexible circuit board 110 against the sensor switch 150. Therefore, no molten molding resin can enter between the flexible circuit board 110 and the sensor switch 150. After the molten molding resin has solidified, the first and second mold parts P101 and P102 are removed. Thus, the molding of the casing 180 as shown in FIGS. 16 to 18 is completed, and at the same time, the mounting of the sensor switch 150 onto the flexible circuit board 110 is completed.

As shown in FIGS. 16 to 18, the casing 180 is provided to cover abutting contact portions T1 and T2 (see FIG. 18) where the terminal plates 151 and 153 and the terminal connection patterns 111 and 113 of the flexible circuit board 110 are in abutting contact with each other. More specifically, the casing 180 is formed by integrally molding a first casing part 180A and a second casing part 180B. The first casing part 180A is provided on the side of the flexible circuit board 110 where the sensor switch 150 is placed so as to enclose the outer periphery of the sensor switch 150. The second casing part 180B is provided on the side of the flexible circuit board 110 opposite to the side thereof where the sensor switch 150 is placed to cover a portion of the flexible circuit board 110 opposing the first casing part 180A (including a portion opposing the sensor switch 150). The second casing part 180B has positioning portions 181 provided at a plurality (2 in this embodiment) of positions on the surface thereof for use in positioning the second casing part 180B when it is to be mounted onto another member. It should be noted that the second casing part 180B is provided with a pair of recesses 183 formed by the pressing portions P107 of the second mold part P102, and the first casing part 180A is provided with a pair of recesses 185 formed by the pressing portions P105 of the first mold part P101.

The positioning portions 181 provided on the second casing part 180B are mounted to predetermined positions on an electronic device (not shown) to effect positioning, and the flexible circuit board 110 and the sensor switch 150 are installed on the electronic device. In other words, the casing 180 has the mounting function of mounting the flexible circuit board 110 and the sensor switch 150 onto another member in addition to the function of electrically and mechanically integrating together the flexible circuit board 110 and the sensor switch 150. If the pivoting lever 191 pivots in the direction of the arrow C as a moving member (not shown) moves in the direction of the arrow E shown in FIG. 16 and abuts against the pivoting lever 191, the ON/OFF state between the terminal plates 151 and 153 switches over.

It should be noted that in this embodiment the first casing part 180A is provided to enclose the outer periphery of the sensor switch 150. Therefore, the sensor switch 150 itself is not covered with the casing 180. Accordingly, the sensor switch 150 is not subjected to an external force that would otherwise be applied thereto when the sensor switch 150 itself is covered with the casing 180. Consequently, there is no possibility that the operation of the mechanical part in the sensor switch 150 will be impaired by the external force (e.g. such a problem that the force needed for pivoting the pivoting lever 191 becomes excessively strong). It should be noted that if there is no likelihood of such a problem, the casing 180 may be formed to also cover the upper surface of the sensor switch 150. Because the positioning portions 181 are provided on the second casing part 180B as stated above, if the positioning portions provided on the sensor switch 150 become impossible to use due to the molding of the casing 180, the positioning portions 181 can be used in place of them.

It should be noted that the casing 180 only needs to be provided to cover at least the abutting contact portions T1 and T2 where the terminal plates 151 and 153 and the terminal connection patterns 111 and 113 of the flexible circuit board 110 are in abutting contact with each other. If the casing 180 is provided in this way, it is possible to increase the securing strength of the abutting contact portions T1 and T2 where the terminal plates 151 and 153 of the sensor switch 150 and the terminal connection patterns 111 and 113 of the flexible circuit board 110 are secured to each other by the casing 180. This is particularly effective when the circuit board 110 is a flexible circuit board.

As has been described above, the electronic component mounting structure according to this embodiment includes, as shown in FIGS. 16 to 18, the flexible circuit board 110 having the terminal connection patterns 111 and 113 formed thereon and the sensor switch 150 provided with the terminal plates 151 and 153. The sensor switch 150 is placed on the flexible circuit board 110. The synthetic resin casing 180 is provided by injection molding to cover the sensor switch 150 and a portion of the flexible circuit board 110 surrounding the sensor switch 150 placed thereon, whereby the terminal plates 151 and 153 of the sensor switch 150 and the terminal connection patterns 111 and 113 of the flexible circuit board 110 are connected in abutting contact with each other. In other words, the sensor switch 150 is mounted onto the flexible circuit board 110 by molding the casing 180. Therefore, the mounting operation becomes efficient and can be automated and facilitated. The electronic component mounting structure is particularly effective when it is used to mount a plurality of sensor switches 150 onto the flexible circuit board 110 by a single molding operation.

According to the above-described embodiment, the terminal plates 151 and 153 of the sensor switch 150 and the terminal connection patterns 111 and 113 of the flexible circuit board 110 are connected in abutting contact with each other by carrying out the following steps: the step of placing the sensor switch 150 on the flexible circuit board 110; the step of setting the flexible circuit board 110 and the sensor switch 150 in the mold (first and second mold parts) P101 and P102; the step of injecting the molten molding resin into the cavity C101 in the mold P101 and P102 having the configuration of the casing 180 that is to be formed to enclose the sensor switch 150 and a portion of the flexible circuit board 110 surrounding the sensor switch 150 placed thereon; and the step of removing the mold P101 and P102 after the molten molding resin has solidified. Therefore, the mounting operation becomes efficient and can be automated and facilitated. The electronic component mounting method is particularly effective when it is used to mount a plurality of sensor switches 150 onto the flexible circuit board 110 by a single molding operation.

Although some embodiments of the present invention have been described above, it should be noted that the present invention is not necessarily limited to the described embodiments but can be modified in a variety of ways within the scope of the appended claims, without departing from the technical idea of the invention described in the specification and the accompanying drawings. It should be noted that any shape, structure or material that offers the operational advantage of the invention in this application is within the scope of the technical idea of the invention in this application even if it is not directly mentioned in the specification or the drawings. For example, a flexible circuit board is used as a circuit board in the first to sixth embodiments. It is, however, also possible to use other various circuit boards, such as rigid resin boards, ceramic boards, and glass boards. Although a light-emitting component or a sensor switch is used as an electronic component in the first to sixth embodiments, it is also possible to use other various electronic components (e.g. diodes, fixed resistors, ICs, LSIs, rotary electronic components, and sliding electronic components). Further, terminals provided on the electronic component are not necessarily limited to the electrodes 51 and 53 formed on the surface of the component body or the terminal plates 151 and 153 projecting from the surface of the component body as in the first to sixth embodiments. The terminals may be made of other various metal plates extending from the inside of the component body and projecting to the surface thereof or patterns that are formed inside the component body and exposed to the surface thereof. In the first to fifth embodiments, the light-emitting part of the light-emitting component is exposed on the surface of the casing, but the light-emitting part does not necessarily need to be exposed in a case where the casing is formed of a transparent material. Although in the first to fifth embodiments the casing 80 is molded to enclose the entire periphery of the light-emitting component 50, the casing 80 may be molded to enclose only a part of the periphery of the light-emitting component 50. In the first to fifth embodiments, the terminal connection patterns 11 and 13 are connected to the electrodes 51 and 53 of the light-emitting component 50 in such a manner as to abut against both the lower and side surfaces of the electrodes 51 and 53. The terminal connection patterns 11 and 13 may, however, be connected to the electrodes 51 and 53 in abutting contact with only the lower or side surfaces of the electrodes 51 and 53 by altering the configurations of the terminal connection patterns 11 and 13.

In all the foregoing embodiments, the terminal connection patterns 11 and 13 (or 111 and 113) and the terminals 51 and 53 (or 151 and 153) of the electronic component 50 (or 150) are connected by bringing them into direct abutting contact with each other and covering them with the casing 80 (or 180). The terminal connection patterns 11 and 13 (or 111 and 113) and the terminals 51 and 53 (or 151 and 153) may further be bonded with an electrically conductive adhesive before being covered with the casing 80 (or 180). As the electrically conductive adhesive, it is possible to use hot-melt type electrically conductive adhesives and anisotropic electrically conductive adhesive besides ordinary electrically conductive adhesives. Although in the sixth embodiment, the positioning portions 181, which are formed from projections, are provided on the second casing part 180B, the positioning portions 181 may be replaced with positioning portions formed from recesses (holes). The essential thing is to provide positioning portions that position the second casing part 180B with respect to another member.

The invention claimed is:

1. An electronic component mounting structure comprising:
    a circuit board having terminal connection patterns formed thereon; and
    an electronic component having terminals formed on a surface thereof;
    wherein said electronic component is placed on said circuit board, and a synthetic resin casing is provided by injection molding to cover said electronic component and a portion of said circuit board surrounding said electronic component placed thereon, whereby said terminals of said electronic component and said terminal connection patterns of said circuit board are connected in abutting contact with each other;
    wherein said circuit board is a flexible circuit board; and
    wherein said circuit board has board bending portions provided outside said electronic component placed thereon, said board bending portions being buried in said casing in a state of being bent toward side surfaces of said electronic component.

2. An electronic component mounting structure according to claim 1, wherein said casing is formed by integral molding to extend over upper and lower sides of said circuit board through openings provided in said circuit board at a periphery of said electronic component placed thereon.

3. An electronic component mounting structure according to claim 1, wherein said electronic component is a light-emitting component having a light-emitting part, and said casing is molded such that said light-emitting part is exposed.

4. An electronic component mounting structure according to claim 1, wherein only terminals formed on a lower surface of said electronic component are connected in abutting contact with said terminal connection patterns of said circuit board.

5. An electronic component mounting structure comprising:
    a circuit board having terminal connection patterns formed thereon; and
    an electronic component having terminals formed on a surface thereof;
    wherein said electronic component is placed on said circuit board, and a synthetic resin casing is provided by injection molding to cover said electronic component and a portion of said circuit board surrounding said electronic component placed thereon, whereby said terminals of said electronic component and said terminal connection patterns of said circuit board are connected in abutting contact with each other;
    wherein said circuit board is a flexible circuit board; and
    wherein said circuit board has board securing portions provided at respective peripheries of said openings of said circuit board, said board securing portions being buried in said casing in a state of being bent toward a side of said circuit board where said electronic component is placed.

6. An electronic component mounting structure according to claim 5, wherein said casing is formed by integral molding to extend over upper and lower sides of said circuit board through openings provided in said circuit board at a periphery of said electronic component placed thereon.

7. An electronic component mounting structure according to claim 5, wherein said electronic component is a light-emitting component having a light-emitting part, and said casing is molded such that said light-emitting part is exposed.

8. An electronic component mounting structure according to claim 5, wherein only terminals formed on a lower surface of said electronic component are connected in abutting contact with said terminal connection patters of said circuit board.

9. An electronic component mounting method comprising:
    preparing a circuit board having terminal connection patterns formed thereon and an electronic component having terminals formed on a surface thereof;
    placing said electronic component on said circuit board;
    setting said circuit board and said electronic component in a mold;
    injecting a molten molding resin into a cavity in said mold having a configuration of a casing that is to be formed to enclose said electronic component and a portion of said circuit board surrounding said electronic component placed thereon; and
    removing said mold after said molten molding resin has solidified;
    whereby said terminals of said electronic component and said terminal connection patterns of said circuit board are connected in abutting contact with each other;
    wherein said circuit board has openings provided at a periphery of said electronic component placed thereon, so that when said molten molding resin is injection-molded, said casing is molded to extend over upper and lower sides of said circuit board through said openings;

wherein said electronic component placed on said circuit board and set in said mold is in abutting contact with an inner surface of said mold at a surface thereof opposite to a surface thereof placed on said circuit board, and said molten molding resin is injected toward a surface of said circuit board opposite to a surface thereof on which said electronic component is placed, thereby filling said molten molding resin also to the side of said circuit board where said electronic component is placed through said openings while pressing said circuit board against said electronic component;

wherein said circuit board is a flexible circuit board; and wherein said circuit board has slits previously formed at a periphery of said electronic component placed thereon, and said molten molding resin is injected toward the surface of said circuit board reverse to the surface thereof on which said electronic component is placed, whereby said circuit board is pressed against said electronic component, and while doing so, portions of said circuit board around said slits are forced to open toward the side of said circuit board where said electronic component is placed, thereby forming said openings.

10. An electronic component mounting method according to claim 9, wherein said electronic component is a light-emitting component having a light-emitting part, wherein a surface of said light-emitting part is kept in abutting contact with the inner surface of said mold when said molten molding resin is injected toward the surface of said circuit board reverse to the surface thereof on which said electronic component is placed, whereby said light-emitting part is exposed on a surface of said casing.

11. An electronic component mounting method according to claim 9, wherein said circuit board has board bending portions provided outside said electronic component placed thereon as a result of formation of said openings by forcing open the portions of said circuit board around said slits, said board bending portions being buried in said casing in a state of being bent toward side surfaces of said electronic component.

12. An electronic component mounting method according to claim 9, wherein said circuit board has board securing portions provided at respective peripheries of said openings as a result of formation of said openings by forcing open the portions of said circuit board around said slits, said board securing portions being buried in said casing in a state of being bent toward the side of said circuit board where said electronic component is placed.

\* \* \* \* \*